US012751306B2

(12) United States Patent
Bchir et al.

(10) Patent No.: US 12,751,306 B2
(45) Date of Patent: Sep. 29, 2026

(54) SUBSTRATE EMPLOYING CORE WITH CAVITY EMBEDDING REDUCED HEIGHT ELECTRICAL DEVICE(S), AND RELATED INTEGRATED CIRCUIT (IC) PACKAGES AND FABRICATION METHODS

(71) Applicant: QUALCOMM Incorporated, San Diego, CA (US)

(72) Inventors: Omar James Bchir, San Marcos, CA (US); Dongming He, San Diego, CA (US); Ryan Lane, San Diego, CA (US); Kuiwon Kang, San Diego, CA (US); Lily Zhao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 599 days.

(21) Appl. No.: 18/310,331

(22) Filed: May 1, 2023

(65) Prior Publication Data

US 2024/0371736 A1 Nov. 7, 2024

(51) Int. Cl.

| | |
|---|---|
| ***H10W 70/685*** | (2026.01) |
| ***H10B 80/00*** | (2023.01) |
| ***H10W 20/20*** | (2026.01) |
| ***H10W 70/05*** | (2026.01) |
| ***H10W 70/68*** | (2026.01) |
| ***H10W 74/01*** | (2026.01) |

(Continued)

(52) U.S. Cl.

CPC .......... *H10W 70/685* (2026.01); *H10B 80/00* (2023.02); *H10W 20/20* (2026.01);

(Continued)

(58) Field of Classification Search

CPC ... H10W 70/685; H10W 20/20; H10W 70/05; H10W 70/68; H10W 74/019;

(Continued)

(56) References Cited

U.S. PATENT DOCUMENTS

| | | | | |
|---|---|---|---|---|
| 2007/0117338 A1 | 5/2007 | Yamamoto et al. | | |
| 2009/0084596 A1* | 4/2009 | Inoue | H05K 1/185 29/846 | |

(Continued)

OTHER PUBLICATIONS

International Search Report and Written Opinion for International Patent Application No. PCT/US2024/024569, mailed Oct. 14, 2024, 17 pages.

(Continued)

*Primary Examiner* — Marlon T Fletcher
*Assistant Examiner* — Christina A Sylvia
(74) *Attorney, Agent, or Firm* — Withrow & Terranova, PLLC

(57) ABSTRACT

Substrate employing core with cavity embedding reduced height electrical device(s), and related integrated circuit (IC) packages and fabrication methods are also disclosed. The cavity of the core (that has one or more core layers) of the substrate includes an embedded electrical device structure that an electrical device built upon another second component(s) to make the overall height of the electrical device structure compatible with the height of the cavity of the core. In this manner, the design criteria used to select thickness or height of the core for providing the desired stability in the substrate can be incompatible with the thickness or the height of the embedded electrical device.

18 Claims, 19 Drawing Sheets

(51) Int. Cl.
*H10W 74/10* (2026.01)
*H10W 90/00* (2026.01)
*H10W 70/09* (2026.01)
*H10W 70/652* (2026.01)

(52) U.S. Cl.
CPC ........... *H10W 70/05* (2026.01); *H10W 70/68* (2026.01); *H10W 74/019* (2026.01); *H10W 74/117* (2026.01); *H10W 90/00* (2026.01); *H10W 70/09* (2026.01); *H10W 70/6528* (2026.01); *H10W 90/736* (2026.01); *H10W 90/738* (2026.01)

(58) Field of Classification Search
CPC ... H10W 74/117; H10W 90/00; H10W 70/09; H10W 70/6528; H10W 90/736; H10W 90/738; H10B 80/00
See application file for complete search history.

(56) References Cited

U.S. PATENT DOCUMENTS

| | | | | |
|---|---|---|---|---|
| 2011/0216513 | A1 | 9/2011 | Lee et al. | |
| 2017/0345767 | A1* | 11/2017 | Watanabe | H01L 23/49866 |
| 2019/0237382 | A1 | 8/2019 | Kim et al. | |
| 2020/0411473 | A1 | 12/2020 | Chen et al. | |
| 2021/0082890 | A1 | 3/2021 | Kim | |
| 2021/0272881 | A1* | 9/2021 | Vaidya | H01L 25/0655 |
| 2022/0007511 | A1 | 1/2022 | Jeong et al. | |
| 2022/0157740 | A1* | 5/2022 | Verhaverbeke | H01L 23/552 |
| 2023/0105030 | A1 | 4/2023 | Hwang | |
| 2024/0355747 | A1 | 10/2024 | Li et al. | |

OTHER PUBLICATIONS

Light, D., "Novel Fine Pitch, Low Profile, Low Cost Connector Technology," IEEE Components, Packaging and Manufacturing Technology Chapter, SCV, Jun. 9, 2010, available from the Internet: [URL: https://ewh.ieee.org/soc/cpmt/presentations/cpmt1006a.pdf], 30 pages.
Rocket PCB, "IC substrate technology Guide," Mar. 24, 2021, available on the Internet: [URL: https://www.rocket-pcb.com/ic-substrate-technology-guide], 12 pages.
U.S. Appl. No. 18/304,195, filed Apr. 20, 2023.

* cited by examiner

SUBSTRATE EMPLOYING CORE WITH CAVITY EMBEDDING REDUCED HEIGHT ELECTRICAL DEVICE(S), AND RELATED INTEGRATED CIRCUIT (IC) PACKAGES AND FABRICATION METHODS

BACKGROUND

I. Field of the Disclosure

The field of the disclosure relates to integrated circuit (IC) packages, and more particularly to design and fabrication of substrates (e.g., package substrates, interposer substrates) for an IC package, wherein the substrate includes a core layer(s) to support embedded electrical devices in the package substrate and to strengthen the substrate to mitigate warpage.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a substrate as a routing substrate (e.g., a package substrate) to provide physical support and an electrical interface to the die(s). The die(s) is electrically interfaced to metal interconnects (e.g., metal traces) exposed in an upper layer of the substrate as part of signal routing paths. The substrate also includes one or more metallization layers that include metal interconnects (e.g., metal traces, metal lines) with vertical interconnect accesses (vias) coupling the metal interconnects together between adjacent metallization layers to provide electrical interfaces between the die(s). If the substrate is a package substrate, the substrate also includes a lower, outer metallization layer that includes metal interconnects coupled to external metal interconnects (e.g., ball grid array (BGA) interconnects) to provide an external interface between or to the die(s) in the IC package. The external metal interconnects can also be coupled (e.g., soldered) to traces in a printed circuit board (PCB) to attach the package to the PCB and interface its die(s) with the circuitry of the PCB.

Some substrates are cored substrates, meaning they include a core layer. A core layer is a centralized layer of the substrate that provides mechanical support and stability to the package substrate and the IC package incorporating the package substrate. For example, a core layer of a package substrate may be made of a reinforced polymer composite material, such as fiberglass reinforced epoxy, or a sheet of glass. The core layer is typically the thickest layer of the substrate and serves as the foundation layer upon which other metallization layers are built. An electrical device may also be embedded in the core layer of a package substrate to provide a desired function for the IC package. Embedding an electrical device in the core layer may serve to reduce the size of the IC package by advantageously consuming area in the core layer that is not otherwise used or needed for electrical signal routing. Embedding an electrical device in the core layer may also minimize the connection path length between the embedded electrical device and a coupled die in the IC package to minimize induction in the connection path. For example, a passive electrical device such as a deep trench capacitor (DTC) or other passive device may be embedded in the core layer of the substrate to provide a decoupling capacitance for circuits in a die in the IC package to shunt noise from one electrical circuit (e.g., a power supply circuit) to another electrical circuit (e.g., a powered electrical circuit). As another example, a resistor or inductor may be embedded in the core layer. As yet another example, a power management IC (PMIC) may be embedded in the core layer as part of a power distribution network (PDN) in the IC package.

SUMMARY OF THE DISCLOSURE

Aspects disclosed herein include a substrate employing a core with a cavity for embedding reduced height electrical device(s). Related integrated circuit (IC) packages and fabrication methods are also disclosed. The substrate is designed to be included in an IC package to support a semiconductor die ("die") and/or other circuits and to provide signal routing paths to the die and/or other circuits as a routing substrate. The substrate includes a core (of one or more core layers) to provide mechanical stability to the substrate and/or an IC package incorporating the substrate to mitigate warpage. An electrical device (e.g., a deep trench capacitor (DTC), inductor, resistor) is embedded in a cavity formed in the core to conserve other areas of the IC package. In exemplary aspects, the cavity of the core of the substrate includes an embedded electrical device structure of an electrical device built upon another second component(s) to make the overall height of the electrical device structure compatible with the height of the cavity of the core. In this manner, the design criteria used to select thickness or height of the core for providing the desired stability in the substrate can be incompatible with the thickness or the height of the embedded electrical device. For example, some applications of a substrate require the core thickness to be much larger than the thickness of embedded electrical devices, which for example may be fabricated using a wafer-level fabrication process. Also, by providing the embedded electrical device as part of the built-up embedded electrical device structure in the cavity of the core, the substrate may be able to be fabricated using existing fabrication techniques that require an outer surface of the embedded device to be planar or substantially planar with the cavity opening. Embedding the embedded electrical device structure in the cavity also provides a surface at the opening of the cavity that is sufficiently firm and stable in which to form (e.g., laminate) subsequent flat metallization layers on the core.

In one exemplary aspect, the embedded electrical device structure that is embedded in the cavity of the core of the substrate includes a first, top electrical device coupled to a second, bottom electrical device in a back-to-front configuration. This builds up the overall height of the embedded electrical device structure to be compatible with the height of the cavity. This also provides an advantage of allowing two (2) electrical devices to be embedded in the cavity. For example, if the electrical devices are capacitors coupled to a power distribution network (PDN) in the package, the additional decoupling capacitance can further reduce the impedance in the PDN. In this regard, a first back side of the first, top electrical device in the embedded electrical device structure is coupled either directly or indirectly to a second front side of the second electrical device in the cavity. A first front side of the first, top electrical device is electrically coupled to first metal interconnects of a first metallization layer of the substrate formed on a first top side of the core adjacent to a first top opening of the cavity and the first front side of the first, top electrical device. A second front side of the second, bottom electrical device is electrically coupled to first metal interconnects of the first metallization layer formed adjacent to the first, top opening of the cavity through vias (e.g., through-silicon-vias (TSVs) that extend from the first metallization layer, through the first, top electrical device, and to external interconnects on the second front side of the second, bottom electrical device. A second back side of the second, bottom electrical device is adjacent to a second bottom opening of the cavity adjacent to a second metallization layer of the substrate formed on a second bottom side of the core.

In another exemplary aspect, the embedded electrical device structure that is embedded in the cavity of the core of the substrate includes a first, top electrical device coupled to a second, bottom electrical device in a back-to-back configuration. This builds up the overall height of the embedded electrical device structure to be compatible with the height of the cavity. This also provides an advantage of allowing two (2) electrical devices to be embedded in the cavity. In this regard, a first back side of the first electrical device in the embedded electrical device structure is coupled either directly or indirectly to a second back side of the second electrical device in the cavity. A first front side of the first, top electrical device is electrically coupled to first metal interconnects of a first metallization layer of the substrate formed on a first top side of the core adjacent to a first top opening of the cavity and the first front side of the first, top electrical device. A second front side of the second, bottom electrical device is electrically coupled to second metal interconnects of a second metallization layer of the substrate formed on a second bottom side of the core adjacent to a second bottom opening of the cavity.

In another exemplary aspect, the embedded electrical device structure that is embedded in the cavity of the core of the substrate is an electrical device that is coupled to a spacer structure (e.g., a Silicon spacer or substrate). A first back side of the electrical device is coupled either directly or indirectly to a first front side of the spacer structure. A first front side of the electrical device is electrically coupled to first metal interconnects of a first metallization layer of the substrate formed on a first top side of the core adjacent to a first top opening of the cavity and the first front side of the electrical device. A second back side of the spacer structure is adjacent to a second bottom opening of the cavity adjacent to a second metallization layer of the substrate formed on a second bottom side of the core.

In an exemplary aspect, the substrate can be a package substrate that provides signal routing paths to the die(s) and/or other circuits and external metal interconnects for external signal routing. In another exemplary aspect, the substrate can be an interposer substrate that provides signal routing paths between multiple die layers, such as in a three-dimensional IC (3DIC) package.

In this regard, in one exemplary aspect, a substrate is provided. The substrate comprises a first metallization structure comprising one or more first metallization layers. The substrate comprises a second metallization structure comprising one or more second metallization layers. The substrate also comprises a core between the first metallization structure and the second metallization structure in a first direction, the core having a first height in the first direction. The core comprises a cavity, and an embedded electrical device structure having a second height of at least the first height in the first direction. The embedded electrical device structure is disposed in the cavity. The embedded electrical device structure comprises a first electrical device adjacent to the first metallization structure and a second component adjacent to the first electrical device and the second metallization structure.

In another exemplary aspect, a method of fabricating a substrate is provided. The method comprises forming a core having a first height in the first direction. The method also comprises forming a cavity in the core. The method also comprises placing an embedded electrical device structure having a second height of at least the first height in the first direction in the cavity, wherein the embedded electrical device structure comprises a first electrical device and a second component adjacent to the first electrical device in the first direction. The method also comprises coupling a first metallization structure comprising one or more first metallization layers to the core and the first electrical device. The method also comprises coupling a second metallization structure comprising one or more second metallization layers to the core and the second electrical device, such that the core is between the first metallization structure and the second metallization structure in the first direction.

BRIEF DESCRIPTION OF THE FIGURES

FIGS. 9B-1-9D-1 is a flowchart illustrating another exemplary fabrication process of fabricating a substrate that includes a core with a cavity formed therein that includes an embedded electrical device structure of a first electrical device coupled to a second electrical device in a back-to-front configuration to make the overall height of the embedded electrical device structure compatible with the height of the cavity of the core, including, but not limited to, the substrates in FIGS. 1 and 2;

FIGS. 10C-1-10H-1 are exemplary fabrication stages during fabrication of the substrate according to the fabrication process in FIGS. 9B-1-9D-1;

FIGS. 9B-2-9D-2 is a flowchart illustrating another exemplary fabrication process of fabricating a substrate that includes a core with a cavity formed therein that includes an embedded electrical device structure of a first electrical device coupled to a second electrical device in a back-to-back configuration to make the overall height of the embedded electrical device structure compatible with the height of the cavity of the core, including, but not limited to, the substrates in FIGS. 1 and 4;

FIGS. 10C-2-10H-2 are exemplary fabrication stages during fabrication of the substrate according to the fabrication process in FIGS. 9B-2-9D-2;

FIGS. 9B-3-9D-3 is a flowchart illustrating another exemplary fabrication process of fabricating a substrate that includes a core with a cavity formed therein that includes an embedded electrical device structure of a first electrical device coupled to a spacer structure to make the overall height of the embedded electrical device structure compatible with the height of the cavity of the core, including, but not limited to, the substrates in FIGS. 1 and 5;

FIGS. 10C-3-10H-3 are exemplary fabrication stages during fabrication of the substrate according to the fabrication process in FIGS. 9B-3-9D-3;

DETAILED DESCRIPTION

Figure 1:
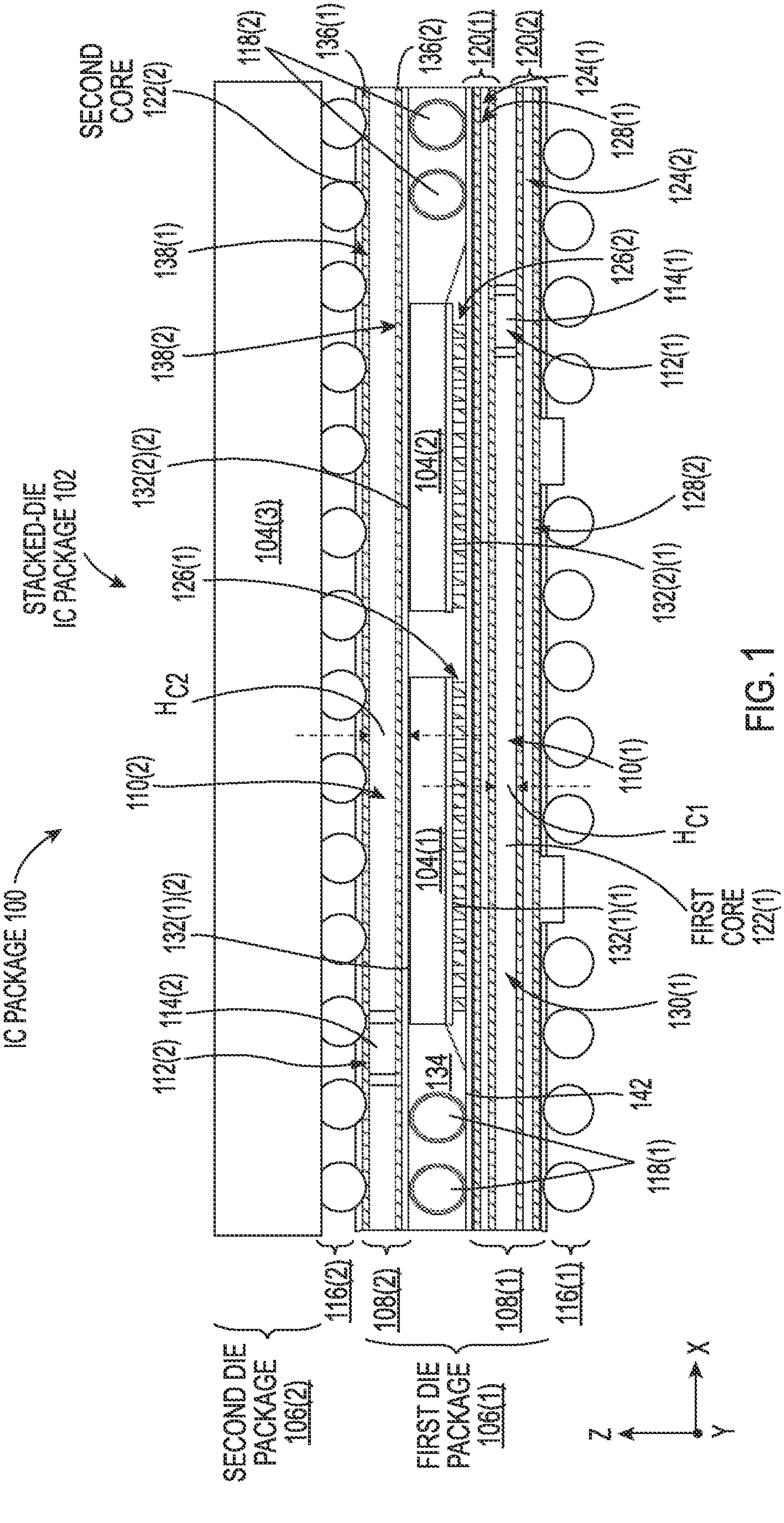
FIG. 1 is a side view of an exemplary package-on-package (POP) integrated circuit (IC) package that includes a first die package coupled to a first substrate as a package substrate, and a second die package stacked vertically above the first die package and coupled to the package substrate through an intervening second substrate as an interposer substrate, wherein the substrate(s) includes a core with a cavity(ies) formed therein that includes an embedded electrical device structure of an electrical device built upon another second component(s) to make the overall height of the embedded electrical device structure compatible with the height of the cavity of the core.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a substrate employing core with cavity embedding reduced height electrical device(s). Related integrated circuit (IC) packages and fabrication methods are also disclosed. The substrate is designed to be included in an IC package to support a semiconductor die ("die") and/or other circuits and to provide signal routing paths to the die and/or other circuits as a routing substrate. The substrate includes a core (of one or more core layers) to provide mechanical stability to the substrate and/or an IC package incorporating the substrate to mitigate warpage. An electrical device (e.g., a deep trench capacitor (DTC), inductor, resistor) is embedded in a cavity formed in the core to conserve other areas of the IC package. In exemplary aspects, the cavity of the core of the substrate includes an embedded electrical device structure that an electrical device built upon another second component(s) to make the overall height of the electrical device structure compatible with the height of the cavity of the core. In this manner, the design criteria used to select thickness or height of the core for providing the desired stability in the substrate can be incompatible with the thickness or the height of the embedded electrical device. For example, some applications of a substrate require the core thickness to be much larger than the thickness of embedded electrical devices, which for example may be fabricated using a wafer-level fabrication process. Also, by providing the embedded electrical device as part of the built up embedded electrical device structure in the cavity of the core, the substrate may be able to be fabricated using existing fabrication techniques that require an outer surface of the embedded device to be planar or substantially planar with the cavity opening. Embedding the embedded electrical device structure in the cavity also provides a surface at the opening of the cavity that is sufficiently firm and stable in which to form (e.g., laminate) subsequent flat metallization layers on the core.

In this regard, FIG. 1 is a side view of an exemplary package-on-package (POP) integrated circuit (IC) package 100 that is a three-dimensional (3D) IC (3DIC) package, also referred to herein as IC package 100. The IC package 100 in this example is a stacked-die IC package 102 that includes first, second, and third semiconductor dies ("dies") 104(1), 104(2), 104(3) in respective first and second die packages 106(1), 106(2) packages stacked on top of and coupled to each other in a first, vertical direction (Z-axis direction). As discussed in more detail below, the IC package 100 includes first and second routing substrates 108(1), 108(2), as substrates 108(1), 108(2), of which any can include a respective first and second core layer 110(1), 110(2) each with a respective first and second cavity 112(1), 112(2) formed in such first and second core layers 110(1), 110(2) in the first, vertical direction (Z-axis direction) to compatibly support embedding electrical devices therein. A "routing substrate," including the first and second routing substrates 108(1), 108(2) as used herein is a nomenclature to refer to a substrate that has one or more metallization layers wherein metal interconnects can be formed therein to provide signal routing paths. As discussed below, any of the first and second cavities 112(1), 112(2) can support a respective first and second embedded electrical device structure 114(1), 114(2) that each includes an electrical device built upon another second component(s) to make the overall height of the first and second embedded electrical device structures 114(1), 114(2) compatible with respective first and second heights $HC_1$, $HC_2$ of the respective first and second cavities 112(1), 112(2) formed in the respective first and second core layers 110(1), 110(2).

Before discussing exemplary aspects of the first and second cavities 112(1), 112(2) of the respective first and second core layers 110(1), 110(2) that support respective first and second embedded electrical device structures 114 (1), 114(2) that each includes an electrical device built upon another second component(s) to make the overall height of the first and second embedded electrical device structures 114(1), 114(2) compatible, other exemplary aspects of the IC package 100 in FIG. 1 are first discussed below.

With continuing reference to FIG. 1, the first die package 106(1) is coupled to the first routing substrate 108(1) as a package substrate 108(1). The package substrate 108(1) provides electrical signal routing paths to first external metal interconnects 116(1) (e.g., ball grid array (BGA) interconnects) to provide an external electrical interface to the dies 104(1)-104(3) of the IC package 100. The first die 104(1) and second die 104(2) are electrically coupled to the first external metal interconnects 116(1) through electrical signal routing paths in the package substrate 108(1). The third die 104(3) is electrically coupled to the first die 104(1), the second die 104(2), and/or the first external metal interconnects 116(1) by being coupled to the second routing substrate 108(2) as an interposer substrate 108(2). The interposer substrate 108(2) includes electrical signal routing paths between the third die 104(3) and the package substrate 108(1) through first vertical interconnects 118(1) (e.g., metal balls). The package substrate 108(1) also includes electrical signal routing paths that electrically couple the first die 104(1) and/or the second die 104(2), to the third die 104(3) through second vertical interconnects 118(2) and the interposer substrate 108(2), and second external metal interconnects 116(2) (e.g., metal lines, metal traces).

In this example, the package substrate 108(1) includes a first, upper metallization structure 120(1) disposed on a first core 122(1) that includes the first core layer 110(1) that includes the first cavity 112(1) for supporting the first embedded electrical device structure 114(1) therein. In this example, the first core 122(1) only includes one core layer, but such is not limiting. A core in this example and as used herein is a central layer(s) that includes one or more core layers and is provided in an IC package or electronic device that typically supports an adjacent metallization layer(s) to provide signal routing paths. The purpose of a core can be to provide a stable and consistent platform that provides outer flat surfaces in which other metallization layers of a substrate can be built upon. The core layer(s) of a core can be manufactured from rigid materials (e.g., fiberglass reinforced epoxy (FR4), polyimide (PI), glass sheet) that provide additional strength and firmness to reduce or avoid warpage in an IC package incorporating the core.

With continuing reference to FIG. 1, the first cavity 112(1) can support either the full or partial embedding of the first embedded electrical device structure 114(1). The first, upper metallization structure 120(1) is a structure that includes one or more first metallization layers 124(1) that include one or more metal layers insulated by insulating layers. Examples of electrical devices that can be provided as part of the first embedded electrical device structure 114(1) that can be embedded either partially or fully in the first cavity 112(1) include, but are not limited to, a capacitor (e.g., a deep trench capacitor (DTC)) a resistor, an inductor, and an IC including an IC provided in a die. The first core 122(1) is disposed on a second, lower metallization structure 120(2) of the package substrate 108(1), between the second, lower metallization structure 120(2) and the first, upper metallization structure 120(1) in the first, vertical direction (Z-axis direction). The second, lower metallization structure 120(2) is a structure that includes one or more second metallization layers 124(2) that include one or more metal layers insulated by insulating layers. The first, upper and second, lower metallization structures 120(1), 120(2) are parallel to each other in second directions (X-axis and Y-axis directions) in this example, orthogonal to the first, vertical direction (Z-axis direction). However, the first, upper and second, lower metallization structures 120(1), 120(2) could also be only partially parallel to each other. The first, upper metallization structure 120(1) provides an electrical interface for signal routing to the first die 104(1), the second die 104(2), and the first and second vertical interconnects 118(1), 118(2).

The first die 104(1) and the second die 104(2) are coupled to respective die interconnects 126(1), 126(2) (e.g., raised metal bumps) that are electrically coupled to first metal interconnects 128(1) (e.g., metal lines, metal traces) in the first, upper metallization structure 120(1). The first metal interconnects 128(1) in the first, upper metallization structure 120(1) are coupled to first metal interconnects 130(1) in the first core 122(1), which are coupled to second metal interconnects 128(2) (e.g., metal lines, metal traces) in the second, lower metallization structure 120(2). In this manner, the package substrate 108(1) provides interconnections between its first, upper and second, lower metallization structures 120(1), 120(2), and the first core 122(1) to provide signal routing to the first die 104(1). The first and/or second external metal interconnects 116(1), 116(2) are coupled to the second metal interconnects 128(2) in the second, lower metallization structure 120(1) to provide interconnections through the package substrate 108(1) to the first die 104(1) and the second die 104(2) through the first and second die interconnects 126(1), 126(2). In this example, first, active sides 132(1)(1), 132(2)(1) of the respective first die 104(1) and second die 104(1) are adjacent to and coupled to the package substrate 108(1), and more specifically to the first, upper metallization structure 120(1) of the package substrate 108(1).

In the example IC package 100 in FIG. 1, an additional, optional second die package 106(2) is provided and coupled to the first die package 106(1) to support multiple dies. For example, the first die 104(1) and/or the second die 104(2) in the first die package 106(1) may include an application processor, and the third die 104(3) may be a memory die, such as a dynamic random access memory (DRAM) die that provides memory support for the application processor. In this regard, in this example, the first die package 106(1) also includes the interposer substrate 108(2) that is disposed on a package mold 134 encasing the first die 104(1) and the second die 104(2), adjacent to respective second, back sides 132(1)(2), 132(2)(2) of the respective first die 104(1) and second die 104(2). The interposer substrate 108(2) also includes a first, upper metallization layer 136(1) and a second, lower metallization layer 136(2) that each include respective first and second metal interconnects 138(1), 138 (2) (e.g., metal lines, metal traces) to provide interconnections to the third die 104(3) in the second die package 106(2). In this example, the interposer substrate 108(1) includes a second core 122(2) disposed on the second, lower metallization layer 136(1) of the interposer substrate 108(2), between the first, upper metallization layer 136(1) and the second, lower metallization layer 136(2) in the first, vertical direction (Z-axis direction). The second core 122(2) can be the same or similar core to the first core 122(1). The first, upper and second, lower metallization layers 136(1), 136(2) are parallel to each other in the second directions (X-axis and Y-axis directions), orthogonal to the first, vertical direction (Z-axis direction). However, the first, upper and second, lower metallization layers 136(1), 136(2) could also be only partially parallel to each other. As discussed in more detail below, in this example, the second core 122(2) can also include the second core layer 110(2) that includes the second cavity 112(2) for supporting the second embedded electrical device structure 114(2) therein. The second die package 106(2) is physically and electrically coupled to the first die package 106(1) by being coupled through the second external metal interconnects 116(2) (e.g., solder bumps, BGA interconnects) to the interposer substrate 108(2). The second external metal interconnects 116(2) are coupled to the first metal interconnects 138(1) in the first, upper metallization layer 136(1) of interposer substrate 108(2), which are coupled to the second metal interconnects 138(2) in the second, lower metallization layer 136(2) and the first and/or second vertical interconnects 118(2), to couple the third die 104(3) to the package substrate 108(1).

Note that another IC package that is not a POP package like the POP IC package 100 in FIG. 1 could be provided that includes substrate that includes a core with a cavity formed therein that includes an embedded electrical device structure of a first electrical device coupled to a second electrical device in a back-to-front configuration to make the overall height of the embedded electrical device structure compatible with the height of the cavity of the core. For example, an IC package that includes such a substrate could be the IC package 100 in FIG. 1 that does not include the second die package 106(1) and the interposer substrate 108(2), and thus does not include the second core 110(2) with an embedded electrical device structure in a cavity in a core of the interposer substrate 108(2), and only includes the package substrate 108(1) the first embedded electrical device structure 114(1) in the first cavity 112(1). A substrate that substrate that includes a core with a cavity formed therein that includes an embedded electrical device structure of a first electrical device coupled to a second electrical device in a back-to-front configuration to make the overall height of the embedded electrical device structure compatible with the height of the cavity of the core can be provided in any type of IC package desired.

By the first and second embedded electrical device structures 114(1), 114(2) being "embedded" in their respective first and second cavities 112(1), 112(2) this means that the first and second embedded electrical device structures 114 (1), 114(2) are at least partially within their respective first and second cavities 112(1), 112(2). For example, the first and/or second embedded electrical device structures 114(1), 114(2) can either partially consume the volume of the respective first and second cavities 112(1), 112(2) in the first, vertical direction (Z-axis direction), or fully consume the volume of the respective first and second cavities 112(1), 112(2) in the first, vertical direction (Z-axis direction). Further, a portion of the first and/or second embedded electrical device structures 114(1), 114(2) can extend outside of the respective first and second cavities 112(1), 112(2).

It may be desired for the first and/or second heights (i.e., thicknesses) $H_{C1}$, $H_{C2}$ of the respective first and second cavities 112(1), 112(2) in the first and second package substrates 108(1), 108(2) in the first, vertical direction (Z-axis direction) and the height of an electrical device embedded therein to be compatible. The first and/or second heights (i.e., thicknesses) $H_{C1}$, $H_{C2}$ are dictated by the first and/or second heights (i.e., thicknesses) $H_{C1}$, $H_{C2}$ of the respective first and second core layers 110(1), 110(2). For example, the first and/or second heights $H_{C1}$, $H_{C2}$ of the respective first and second cores 122(1), 122(2), that then dictate the first and/or second heights $H_{C1}$, $H_{C2}$ of the first and second cavities 112(1), 112(2) formed therein may be based on the particular application of the IC package 100 and its need for stability and support to reduce or avoid warpage. The first and/or second heights $H_{C1}$, $H_{C2}$ of the respective first and second core substrates 122(1), 122(2) may also be based on the application of the IC package 100 including the circuit board that the IC package 100 is to be attached to. For example, some applications of an IC package 100 may require the first and/or second heights $H_{C1}$, $H_{C2}$ of the respective first and/or second cores 122(1), 122(2) to be much larger than the thickness of an embedded electrical device for stability and/or to make the IC package 100 solderable to another circuit board. For example, an electrical device to be embedded in the first and/or second cavity 112(1), 112(2) of a respective first and second core layer 110(1), 110(2) may be a wafer-level fabricated device that is much smaller in thickness than the first and/or second heights $H_{C1}$, $H_{C2}$ of the respective first and/or second cores 122(1), 122(2). However, the desired or necessary first and/or second heights $H_{C1}$, $H_{C2}$ of the respective first and second cores 122(1), 122(2) may be incompatible with the thickness or the height of an electrical device to be embedded therein. If the first and/or second heights $H_{C1}$, $H_{C2}$ of the respective first and second cores 122(1), 122(2) are greater than the thickness of an electrical device to be embedded in the first and/or second cavity 112(1), 112(2) formed therein, it may not be feasible to embed such electrical devices in the first and/or second cavities 112(1), 112(2). For example, an undulation may result in areas of the first and/or second cavities 112(1), 112(2) adjacent to the first and/or second metallization layers 124(1), 124(2), 136(1), 136(2) due to the voids in such first and/or second cavities 112(1), 112(2) not consumed by its embedded electrical device being filled in with a filler material (e.g., the resin material) used to form the insulating layers of the first and/or second metallization layers 124(1), 124(2), 136(1), 136(2). This may cause an uneven surface at the respective first and/or second core layers 110(1), 110(2) in which the first and/or second metallization layers 124(1), 124(2), 136(1), 136(2) are formed thereby causing fabrication quality issues in the first and/or second metallization layers 124(1), 124(2), 136(1), 136(2).

Also, if the first and/or second heights $H_{C1}$, $H_{C2}$ of the respective first and second cores 122(1), 122(2) are greater than the thickness of an electrical device to be embedded in the first and/or second cavity 112(1), 112(2) formed therein, fabrication processes that provide for an adhesion layer to be disposed on the outer surfaces of the first and/or second core layers 110(1), 110(2) to suspend an electrical device to be placed in a respective first and/or second cavities 112(1), 112(2) may not be possible. Also, if the first and/or second heights $H_{C1}$, $H_{C2}$ of the respective first and second cores 122(1), 122(2) are greater than the thickness of an electrical device to be embedded in the first and/or second cavity 112(1), 112(2) formed therein, an active, front side surface of an electrical device embedded in the first and/or second cavity 112(1), 112(2) where its external interconnects are located to provide electrical connections may not be flush with the opening of the first and/or second cavity 112(1), 112(2). This would create a routing gap, such that electrical connections cannot be easily made from adjacent first and/or second metal interconnects 128(1), 138(2) in respective adjacent first and/or second metallization layers 124(1), 124(2), 136(1), 136(2).

In this regard, as discussed in examples in more detail below, the first and/or second cavities 112(1), 112(2) in the respective first and/or second core layers 110(1), 110(2) in the IC package 100 in FIG. 1 can include respective first and/or second embedded electrical device structures 114(1), 114(2) that have an electrical device (e.g., a passive device, such as a DTC, a capacitor, an inductor, a resistor, or a semiconductor die) built upon another second component(s) to make the overall height of the first and/or second embedded electrical device structures 114(1), 114(2) compatible with the respective heights $H_{C1}$, $H_{C2}$ of the first and/or second cavities 112(1), 112(2) of the respective first and/or second core layers 110(1), 110(2). In this manner, the design criteria used to select thickness or height of the core layer for providing the desired stability in the first and/or second substrates 108(1), 108(2) can be incompatible with the heights or thicknesses of the first and/or second embedded electrical device structures 114(1), 114(2).

In one exemplary aspect, as discussed in more detail below, the first and/or second embedded electrical device structures 114(1), 114(2) can include a first, top electrical device coupled to a second, bottom electrical device in a back-to-front configuration. In another exemplary aspect, as also discussed in more detail below, the first and/or second embedded electrical device structures 114(1), 114(2) can include a first, top electrical device coupled to a second, bottom electrical device in a back-to-back configuration. These examples build up the overall height of the first and/or second embedded electrical device structures 114(1), 114(2) to be compatible with the respective heights $H_{C1}$, $H_{C2}$ of the first and/or second cavities 112(1), 112(1), while also allowing two (2) electrical devices to be embedded in the first and/or second cavities 112(1), 112(2). In yet another exemplary aspect, as discussed in more detail below, the first and/or second embedded electrical device structures 114(1), 114(2) can be an electrical device that is coupled to a spacer structure (e.g., a Silicon spacer or substrate) to make the overall heights of the first and/or second embedded electrical device structures 114(1), 114(2) compatible with the first and/or second cavities 112(1), 112(2).

Figure 2:
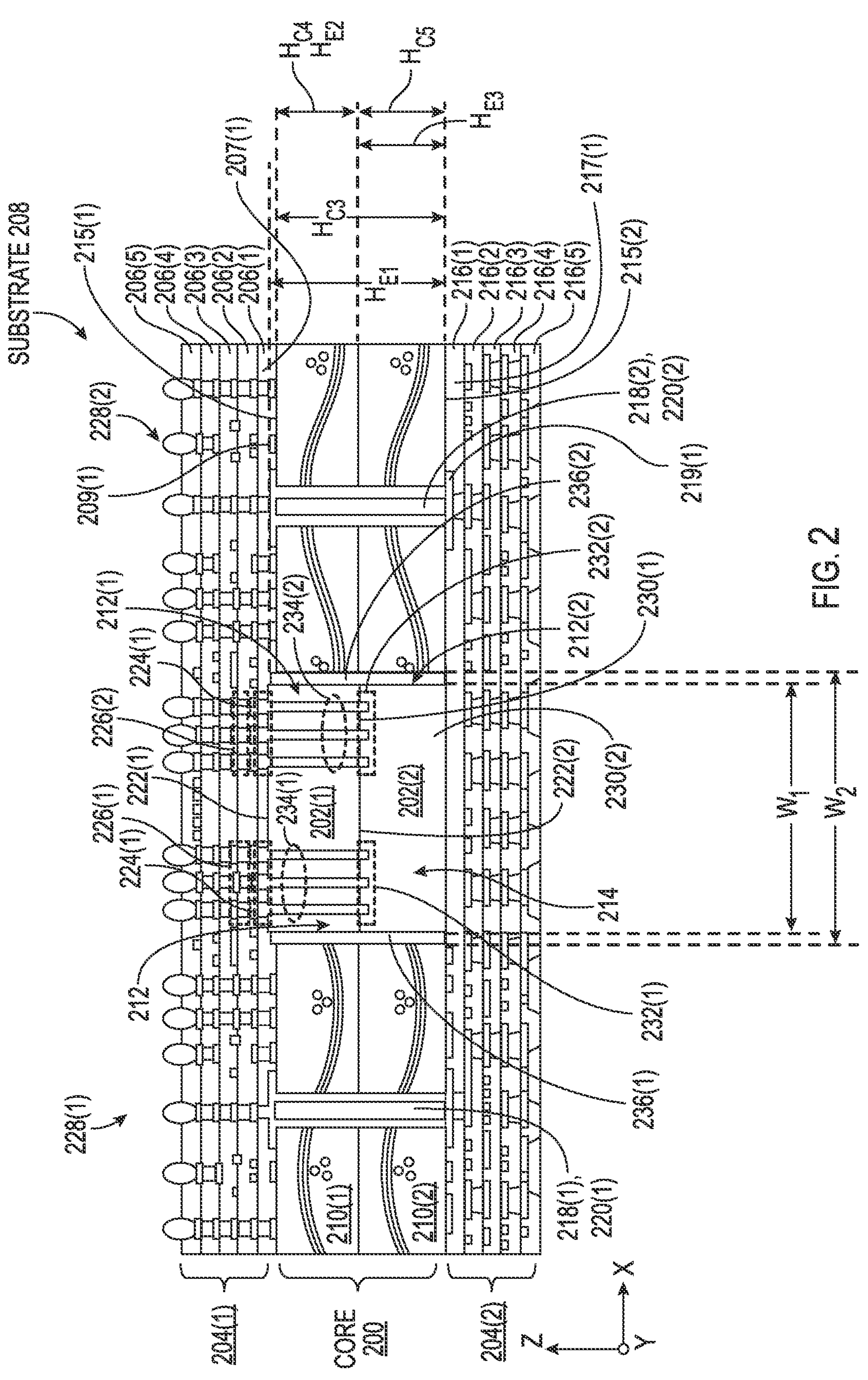
FIG. 2 is a side view of an exemplary substrate that can be provided as a substrate in the IC package in FIG. 1, wherein the substrate(s) includes a core with a cavity formed therein that includes an embedded electrical device structure of a first electrical device coupled to a second electrical device in a back-to-front configuration to make the overall height of the embedded electrical device structure compatible with the height of the cavity of the core.

FIG. 2 is a side view of an exemplary substrate 208 that includes a core 200 with a cavity 212 formed therein that includes an embedded electrical device structure 214. The embedded electrical device structure 214 embedded in the cavity 212 includes a first electrical device 202(1) coupled to a second electrical device 202(2) as a second component 202(2) in a back-to-front configuration to make the overall height $H_{E1}$ of the embedded electrical device structure 214 compatible with the height $H_{C3}$ of the cavity of the core 200 and its cavity 212. As non-limiting examples, the substrate 208 in FIG. 2 can be provided as the first and/or second substrate 108(1), 108(2) in the IC package 100 in FIG. 1. By the embedded electrical device structure 214 being "embedded" in the cavity 212, this means that the embedded electrical device structure 214 is at least partially within the cavity 212. For example, the embedded electrical device structure 214 can either partially consume the volume of the cavity 212 in the first, vertical direction (Z-axis direction), or fully consume the volume of the cavity 212 in the first, vertical direction (Z-axis direction). Further, a portion of the embedded electrical device structure 214 can extend outside of the cavity 212 as shown in the example in FIG. 2.

With reference to FIG. 2, the core 200 includes two (2) core layers 210(1), 210(2) in which the cavity 212 is formed, but such is not limiting. For example, the two (2) core layers 210(1), 210(2) may be provided in the core 200 to provide the desired stability in the substrate 208 to mitigate or avoid warpage. Note however, that the two core layers 210(1), 210(2) could also be provided as a single, monolithic core layer. The substrate 208 includes a first, upper metallization structure 204(1) that includes a plurality of first metallization layers 206(1)-206(5) that each include respective insulating layers with one or more metal interconnects for therein for signal routing. For example, this is shown for the first metallization layer 206(1) that includes a first insulating layer 207(1) with first metal interconnects 209(1) formed therein. The substrate 208 also includes a second, lower metallization structure 204(2) that includes a plurality of second metallization layers 216(1)-216(5) to provide signal routing paths between the first, upper and second, lower metallization structures 204(1), 204(2) through the core 200. The second metallization layers 216(1)-216(5) each include respective insulating layers with one or more metal interconnects for therein for signal routing. For example, this is shown for the second metallization layer 206(1) that includes a second insulating layer 217(1) with second metal interconnects 219(1) formed therein. The core 200 is disposed between the first metallization structure 204(1) and the second metallization structure 204(2) in a first, vertical direction (Z-axis direction). In this example, the first and second metallization structures 204(1), 204(2) and the core 200 are parallel to each other in a second, horizontal direction (X- and Y-axes directions). For example, as discussed in more detail below, the first electrical device 202(1) and second electrical device 202(2) are electrically coupled to the first metallization structure 204(1).

Vertical interconnects 218(1), 218(2) in the form of metal posts 220(1), 220(2) in this example are formed through the core 200 through the combined, coupled first and second core layers 210(1), 210(2) to provide pass through signal routing paths between the first, upper and second, lower metallization structures 204(1), 204(2). In this example, the core layers 210(1), 210(2) are parallel to each in a second, horizontal direction (X- and Y-axes directions), but note that some or all of the first and second core layers 210(1), 210(2) could also only be partially parallel to each other. The cavity 212 is formed by the first and second core layers 210(1), 210(2) each having respective first and second cavity sections 212(1), 212(2) of respective heights (i.e., thicknesses) $H_{C4}$, $H_{C5}$ in the first, vertical direction (Z-axis direction) that are each configured to support the embedded electrical device structure 214. Note that the first and/or second core layers 210(1), 210(2) can consist of one or more smaller thickness material layers, including composite material layers that are laminate or built upon each other, such as built up pre-impregnated (PPG) layers of material (e.g., a reinforced material, such as fiberglass (e.g., FR4), fibers impregnated with a thermosetting resin, such as epoxy or PI). The height $H_{E1}$ of the embedded electrical device structure 214 in the first, vertical direction (Z-axis direction) is designed to be compatible with the overall height $H_{C3}$ of the cavity 212 formed by the first and second cavity sections 212(1), 212(2) of respective heights $H_{C4}$, $H_{C5}$ being coupled together and aligned in the first, vertical direction (Z-axis direction) through the coupling and alignment of the first and second core layers 210(1), 210(2) in the first, vertical direction (Z-axis direction). Note that in this example, there is only one single cavity 212 formed in the core 200, but forming such single cavity 212 in the core forms individual first and second cavity sections 212(1), 212(2) with the respective and second core layers 210(1), 210(2). Thus, the first and second cavity sections 212(1), 212(2) can physically be the single cavity 212 that intersects in the first, vertical direction (Z-axis direction) with both the first and second core layers 210(1), 210(2). Note that alternatively, the first and second cavity sections 212(1), 212(2) could be formed separately in each of the first and second core layers 210(1), 210(2) as separate process steps if desired, instead of in one process step after the first and second core layers 210(1), 210(2) are coupled together.

With continuing reference to FIG. 2, the first electrical device 202(1) of the embedded electrical device structure 214 has a height $H_{E2}$ that is the same height as the first cavity section 212(1) in this example, which is less than the overall height $H_{C3}$ of the core 200 and the cavity 212. Thus, in this example, to avoid a void area being created in the cavity 212 from the embedding of the first electrical device 202(1) having the height $H_{E2}$ less than the overall height $H_{C3}$ of the core 200 that could cause undulation in the first and/or second metallization structures 204(1), 204(2) and/or fabrication issues as previously discussed above, in this example, the embedded electrical device structure 214 also includes the second electrical device 202(2) that is adjacent to (and could be coupled to) the first electrical device 202(1) in the first, vertical direction (Z-axis direction). In this example, the first electrical device 202(1) is directly coupled to the second electrical device 202(2), but this is not required. For example, a film or intervening adhesive material or layer could be provided between the first and second electrical devices 202(1), 202(2). Providing the second electrical device 202(2) adjacent to first electrical device 202(1) in the first, vertical direction (Z-axis direction) as part of the embedded electrical device structure 214 serves to reduce or remove void space in the cavity 212.

For example, in this example, the overall height $H_{E1}$ of the embedded electrical device structure 214 is the same as or greater than the overall height $H_{C3}$ of the cavity 212. The height $H_{E2}$ of the first electrical device 202(1) is less than the overall height $H_{E1}$ of the embedded electrical device structure 214. The height $H_{E3}$ of the second electrical device 202(2) is also less than the overall height $H_{E1}$ of the embedded electrical device structure 214, but the combined heights $H_{E2}$, $H_{E3}$ of the first and second electrical devices 202(1), 202(2) contributes to the overall height $H_{E1}$ of the embedded electrical device structure 214 to reduce or avoid void areas in the cavity 212.

Figure 3:
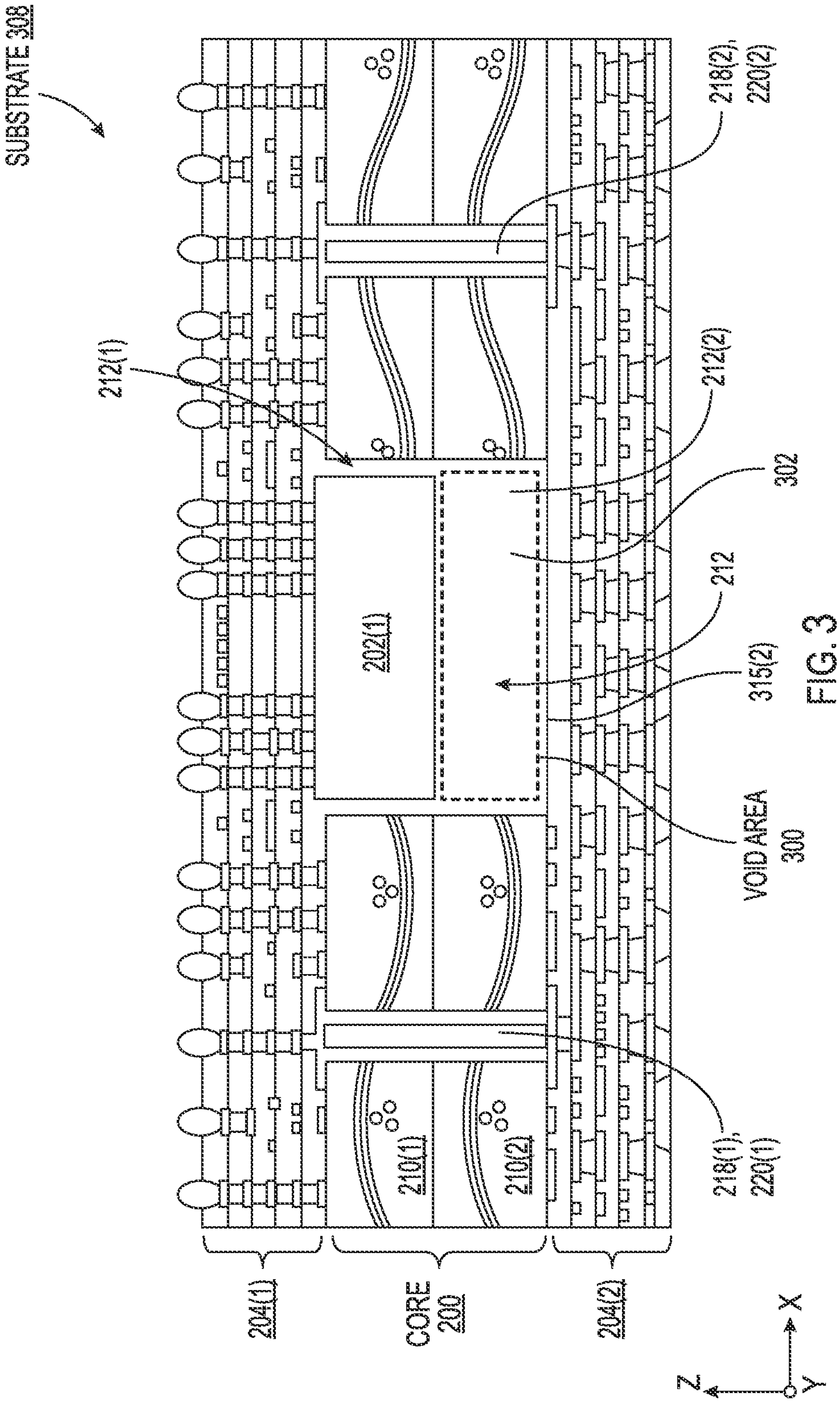
FIG. 3 is a side view of a substrate that includes a core with a cavity formed therein that includes an electrical device embedded in a cavity in the core, wherein a filler material is filled in the cavity as a result of the thickness or height of the embedded electrical device being less than the thickness or height of the core.

For this example, this is in contrast to the substrate 308 in FIG. 3, which also includes the cavity 212 in the core 200 like in the substrate 208 in FIG. 2. However, as shown in FIG. 3, only the first electrical device 202(1) is disposed in the cavity 212 thus leaving a void area 300 during fabrication in the first, vertical direction (Z-axis direction) in the cavity 212 that includes the entire or partial area of the second cavity section 212(2) in the second core layer 210(2). The void area 300 is filled with a filler material 302 (e.g., the resin material) used to form the insulating layers of the metallization layers of the first and/or second metallization structures 204(1), 204(2). However, an undulation may result in void area 300 filled with the filler material 302 that is not as firm as materials used to form the core 200 and/or another second component 202(2) like shown in FIG. 2. Thus, this may cause an uneven surface at a bottom surface 315(2) of the core 200 in which second metallization structure 204(2) is formed thereby causing fabrication quality issues in the second metallization structure 204(2). In the substrate 308 in FIG. 3, the first electrical device 202(1) is not built up with another component, such as another, second electrical device like the electrical device 202(2) in FIG. 2, to reduce or eliminate undulation that may be caused where the filler material 302 is filled in the void area 300 in the cavity 212 of the substrate 308.

With reference back to FIG. 2, in this example, the first electrical device 202(1) of the embedded electrical device structure 214 is adjacent to the first metallization structure 204(1). The second electrical device 202(2) of the embedded electrical device structure 214 is adjacent to the second metallization structure 204(2). Providing the second electrical device 202(2) in the embedded electrical device structure 214 could have an advantage of being able to embed a second electrical device in the core 200 to conserve area in an IC package including the substrate 208. For example, if the first and second electrical devices 202(1), 202(2) are passive devices (e.g., a capacitor(s) (e.g., DTC(s)) resistor(s), inductor(s)), providing the addition of the second electrical device 202(2) could provide additional decoupling capacitance in a PDN provided in the first and/or second metallization structures 204(1), 204(2), for example.

In this example, as shown in FIG. 2, the first and second electrical devices 202(1), 202(2) are provided in the cavity 212 in a back-to-front configuration. In this regard, in this example, the first electrical device 202(1) has a first front side 222(1) adjacent to the first metallization structure 204(1), and a first back side 222(2) opposite the first front side 222(1) in the first, vertical direction (Z-axis direction). In this example, the core 200 includes a first surface 215(1) that is adjacent to the first metallization structure 204(1) and a second surface 215(2) opposite the first surface 215(2) in the first, vertical direction (Z-axis direction) that is adjacent to the second metallization structure 204(2). The first front side 222(1) of the first electrical device 202(1) can be co-planar with the first surface 215(1) of the core 200 in the first, vertical direction (Z-axis direction). Alternatively, in another example, the first front side 222(1) of the first electrical device 202(1) can extend beyond the first surface 215(1) of the core 200 in the first, vertical direction (Z-axis direction). The first electrical device 202(1) includes first metal interconnects 224(1), 224(2) that are exposed from the first front side 222(1) of the first electrical device 202(1) to provide electrical connections to the first electrical device 202(1). In this example, the first metal interconnects 224(1), 224(2) are coupled to first metal interconnects 226(1), 226(2) in a first metallization layer 206(1) of the first metallization structure 204(1) to provide an electrical connection between the first electrical device 202(1) and the first metallization structure 204(1). If desired, other metal interconnects in some or all of the other first metallization layers 206(2)-206(5) can be utilized to provide signal routing paths to external interconnects 228(1), 228(2) and/or the second metallization structure 204(2) through signal routing paths provided through the first and/or second vertical interconnects 218(1), 218(2).

In this example, the second electrical device 202(2) has a second front side 230(1) and a second back side 230(2) adjacent to the second metallization structure 204(2). The second back side 230(2) of the second electrical device 202(2) is opposite of the second front side 230(1) in the first, vertical direction (Z-axis direction). In this example, the second back side 230(2) of the second electrical device 202(2) can be co-planar with the second surface 215(2) of the core 200 in the first, vertical direction (Z-axis direction). Alternatively, in another example, the second back side 230(2) of the second electrical device 202(2) can extend beyond the second surface 215(2) of the core 200 in the first, vertical direction (Z-axis direction). In this configuration, the second electrical device 202(2) includes second metal interconnects 232(1), 232(2) that are exposed from the second front side 230(1) of the second electrical device 202(2) to provide electrical connections to the second electrical device 202(2). Given the back-to-front configuration between the second electrical device 202(2) to the first electrical device 202(1), in this example, the second metal interconnects 232(1), 232(2) of the second electrical device 202(2) are adjacent to the first back side 222(2) of the first electrical device 202(1). Thus, the second metal interconnects 232(1), 232(2) of the second electrical device 202(2) are not directly adjacent to either the first or second metallization structure 204(1), 204(2) to provide direct electrical connections between the first or second metallization structure 204(1), 204(2) and the second metal interconnects 232(1), 232(2).

In this regard, to provide electrical connections to the second electrical device 202(2), vias 234(1), 234(2) are provided. The vias 234(1), 234(2) are coupled to the first metal interconnects 226(1), 226(2) in the first metallization layer 206(1) of the first metallization structure 204(1) and the second metal interconnects 232(1), 232(2) of the second electrical device 202(2) to provide an electrical connection between the second electrical device 202(2) and the first metallization structure 204(1). The vias 234(1), 234(2) extend through the first electrical device 202(1) in the first, vertical direction (Z-axis direction) from the first front side 222(1) to the first back side 222(2) and to the second metal interconnects 232(1), 232(2) of the second electrical device 202(2). In this example, the vias 234(1), 234(2) are aligned in the first, vertical direction (Z-axis direction) with the second metal interconnects 232(1), 232(2) of the second electrical device 202(2). In this example, the vias 234(1), 234(2) are through-silicon-vias (TSVs). In this manner, the second electrical device 202(2) can be oriented with its second front side 230(1) adjacent to the first back side 222(2) of the first electrical device 202(1) and the second electrical device 202(2) can be electrically coupled to the first metallization structure 204(1). For example, in this example, the vias 234(1), 234(2) may couple both the first and second metal interconnects 224(1), 224(2) such that the first and second electrical devices 202(1), 202(2) are electrically coupled together either in series or parallel. In this example, it may be important to not only align the vias 234(1), 234(2) with the second metal interconnects 232(1), 232(2) of the second electrical device 202(2) in the first, vertical direction (Z-axis direction), but also to align the vias 234(1), 234(2) with the first metal interconnects 224(1), 224(2) of the first electrical device 202(1) also in the first, vertical direction (Z-axis direction). Also, by the connection of the vias 234(1), 234(2) extending through the first electrical device 202(1) and coupled to the second metal interconnects 232(1), 232(2) of the second electrical device 202(2), this can assist in or provide the coupling of the second electrical device 202(2) to the first electrical device 202(1).

Note that in this example, although the first and second electrical devices 202(1), 202(2) are shown as having the same width $W_1$ in the cavity 212, such is not required. The first and second electrical devices 202(1), 202(2) can have varying, different widths. Further, the width $W_1$ of the first and second electrical devices 202(1), 202(2) in the second, horizontal direction (X-axis direction) do not have to extend to the full width $W_2$ of the cavity 212. Filler material 236(1), 236(2), such as the insulating material (e.g., resin material) used to form the insulating material of the first metallization layer 206(1) and/or the second metallization layer 216(1) on the core 200 can also be used to fill in any smaller voids in the second, horizontal direction (X-axis direction) when the first metallization layer 206(1) and/or the second metallization layer 216(1) are fabricated on the core 200.

Also, note that the embedded electrical device structure 214 that can be disposed in the cavity 212 of the core 200 is not limited to only two (2) electrical devices being disposed in such cavity 212. More than two (2) electrical devices could be disposed in the cavity 212. Also note that the core 200 is not limited to only one cavity, like cavity 212, being disposed therein to support an embedded electrical device structure, like embedded electrical device structure 214. Multiple cavities could be formed in the core 200 wherein an embedded electrical device structure could be disposed within each cavity.

Figure 4:
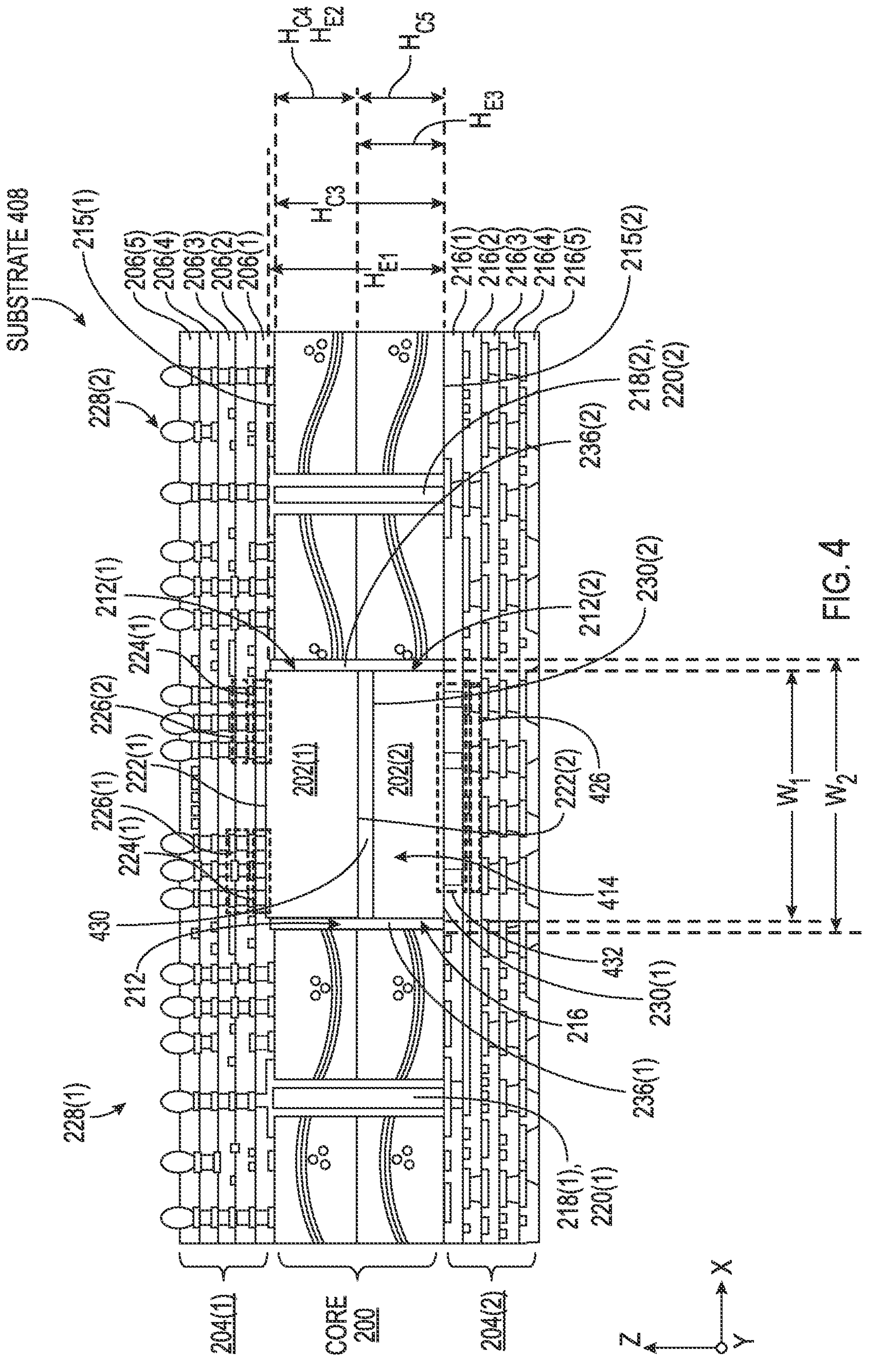
FIG. 4 is a side view of another exemplary substrate that can be provided as a substrate in the IC package in FIG. 1, wherein the substrate(s) includes a core with a cavity formed therein that includes an embedded electrical device structure of a first electrical device coupled to a second electrical device in a back-to-back configuration to make the overall height of the embedded electrical device structure compatible with the height of the cavity of the core.

Note that other configurations of providing a first and second electrical device embedded in a cavity of a core, like the core 200 in FIG. 2, are also possible. For example, FIG. 4 is a side view of another exemplary substrate 408 that includes the core 200 with the cavity 212 formed therein for supporting an embedded electrical device structure like the substrate 208 in FIG. 2. Common elements between the substrate 408 in FIG. 4 and the substrate 208 in FIG. 2 are shown with common element numbers and thus do not have to be re-described. However, in the substrate 408 in FIG. 4, the cavity 212 includes an alternative embedded electrical device structure 414 that includes the first electrical device 202(1) and the second electrical device 202(2) in a back-to-back configuration. In this configuration, the second electrical device 202(2) is rotated 180 degrees from its orientation in FIG. 2, such that first back side 222(2) of the first electrical device 202(1) is adjacent to the second back side 230(2) of the second electrical device 202(2) in a back-to-back configuration.

By the embedded electrical device structure 414 being "embedded" in the cavity 212, this means that the embedded electrical device structure 414 is at least partially within the cavity 212. For example, the embedded electrical device structure 414 can either partially consume the volume of the cavity 212 in the first, vertical direction (Z-axis direction), or fully consume the volume of the cavity 212 in the first, vertical direction (Z-axis direction). Further, a portion of the embedded electrical device structure 414 can extend outside of the cavity 414 as shown in the example in FIG. 4.

In this example, the second front side 230(1) of the second electrical device 202(2) can be co-planar with the second surface 215(2) of the core 200 in the first, vertical direction (Z-axis direction). Alternatively, in another example, the second front side 230(1) of the second electrical device 202(2) can extend beyond the second surface 215(2) of the core 200 in the first, vertical direction (Z-axis direction). In this configuration, the second electrical device 202(2) includes second metal interconnects 432 that are exposed from the second front side 230(1) of the second electrical device 202(2) to provide electrical connections to the second electrical device 202(2). Given the back-to-back configuration between the second electrical device 202(2) to the first electrical device 202(1), in this example, the second metal interconnects 432 of the second electrical device 202(2) are adjacent to the second metallization structure 204(2). Thus, the second metal interconnects 432 of the second electrical device 202(2) are directly adjacent to the second metallization structure 204(2) such that the second metal interconnects 432 can be coupled to second metal interconnects 426 to provide direct electrical connections between the second metallization structure 204(2) and the second electrical device 202(2).

In this example, the first back side 222(2) of the first electrical device 202(1) is coupled to the second back side 230(2) of the second electrical device 202(2) through an adhesive layer 430, which may be an adhesive film or adhesive material, provided between the first and second electrical devices 202(1), 202(2). For example, the adhesive layer 430 may be a die attach file (DAF) if the first and second electrical devices 202(1), 202(2) are dies. Providing the adhesive layer 430 to couple the first and second electrical devices 202(1), 202(2) together is possible without interfering with the second metal interconnects 426 of the second electrical device 202(2), because the second electrical device 202(2) is in a back-to-back configuration with the first electrical device 202(1). Alternatively, the first back side 222(2) of the first electrical device 202(1) could be directly coupled to the second back side 230(2) of the second electrical device 202(2), such as through a compression bond.

Also note that in this example, although the first and second electrical devices 202(1), 202(2) are shown as having the same width $W_1$ in the cavity 212, such is not required. The first and second electrical devices 202(1), 202(2) can have varying, different widths. Further, the width $W_1$ of the first and second electrical devices 202(1), 202(2) in the second, horizontal direction (X-axis direction) do not have to extend to the full width $W_2$ of the cavity 212. Filler material 236(1), 236(2), such as the insulating material (e.g., resin material) used to form the insulating material of the first metallization layer 206(1) and/or the second metallization layer 216(1) on the core 200 can also be used to fill in any smaller voids in the second, horizontal direction (X-axis direction) when the first metallization layer 206(1) and/or the second metallization layer 216(1) are fabricated on the core 200.

Figure 5:
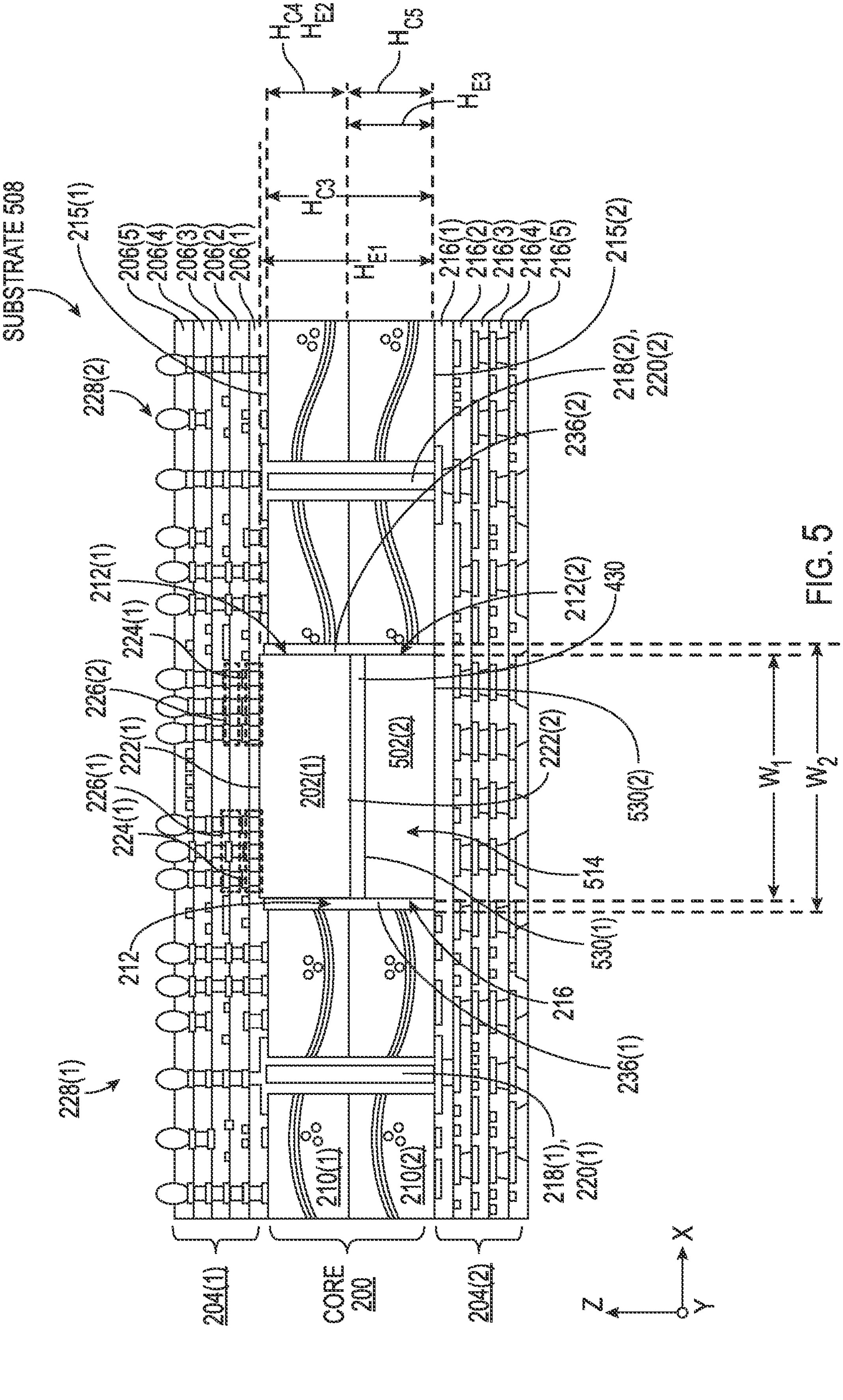
FIG. 5 is a side view of a substrate that can be provided as a substrate in the IC package in FIG. 1, wherein the substrate(s) includes a core with a cavity formed therein that includes an embedded electrical device structure of a first electrical device coupled to a spacer structure to make the overall height of the embedded electrical device structure compatible with the height of the cavity of the core.

FIG. 5 is a side view of yet another exemplary substrate 508 that includes the core 200 with the cavity 212 formed therein for supporting an embedded electrical device structure like the substrates 208, 408 in FIGS. 2 and 4. Common elements between the substrate 508 in FIG. 5 and the substrate 208 in FIG. 2 and/or substrate 408 in FIG. 4 are shown with common element numbers and thus do not have to be re-described. However, in the substrate 508 in FIG. 5, the cavity 212 includes an alternative embedded electrical device structure 514 that includes the first electrical device 202(1) and a second spacer 502(2) that is not an electrical device. For example, the second spacer 502(2) could be a silicon spacer (e.g., silicon substrate) that is formed in a wafer-level fabrication processes, which may be how the first electrical device 202(1) is formed. The second spacer 502(2) provides additional structure in the first, vertical direction (Z-axis direction) to remove or reduce the void space in the cavity 212 like the second electrical device 202(2) in the substrates 208 and 408 in FIGS. 2 and 4, but without such providing a second electrical device.

By the embedded electrical device structure 514 being "embedded" in the cavity 212, this means that the embedded electrical device structure 514 is at least partially within the cavity 212. For example, the embedded electrical device structure 514 can either partially consume the volume of the cavity 212 in the first, vertical direction (Z-axis direction), or fully consume the volume of the cavity 212 in the first, vertical direction (Z-axis direction). Further, a portion of the embedded electrical device structure 514 can extend outside of the cavity 212 as shown in the example in FIG. 5.

Similar to the substrates 208, 408 in FIGS. 2 and 4, in the substrate 508 in FIG. 5, to avoid a void area being created in the cavity 212 from the embedding of the first electrical device 202(1) that has a height $H_{E2}$ less than the overall height $H_{C3}$ of the core 200, the embedded electrical device structure 514 also includes the second spacer 502(2) that is adjacent to (and could be coupled to) the first electrical device 202(1) in the first, vertical direction (Z-axis direction). Providing the second spacer 502(2) adjacent to first electrical device 202(1) in the first, vertical direction (Z-axis direction) as part of the embedded electrical device structure 514 serves to reduce or remove void space in the cavity 212.

For example, in this example, the overall height $H_{E1}$ of the embedded electrical device structure 514 is the same or greater than the overall height $H_{C3}$ of the cavity 212. The height $H_{E2}$ of the first electrical device 202(1) is less than the overall height $H_{E1}$ of the embedded electrical device structure 514. The height $H_{E3}$ of the second spacer 502(2) is also less than the overall height $H_{E1}$ of the embedded electrical device structure 514, but the combined heights $H_{E2}$, $H_{E3}$ of the first electrical device 202(1) and second spacer 502(2) contribute to the overall height $H_{E1}$ of the embedded electrical device structure 514 to reduce or avoid void areas in the cavity 212.

The second spacer 502(2) of the embedded electrical device structure 514 is adjacent to the second metallization structure 204(2). The second spacer 502(2) has a second front side 530(1) and a second back side 530(2) adjacent to the second metallization structure 204(2). The second back side 530(2) of the second spacer 502(1) is opposite of the second front side 530(1) in the first, vertical direction (Z-axis direction). In this example, the second back side 530(2) of the second spacer 502(2) can be co-planar with the second surface 215(2) of the core 200 in the first, vertical direction (Z-axis direction). Alternatively, in another example, the second back side 530(2) of the second spacer 502(2) can extend beyond the second surface 215(2) of the core 200 in the first, vertical direction (Z-axis direction). Given the second spacer 502(2) is not an electrical device that includes metal interconnects in this example, the orientation of the second spacer 502(2) can be changed without affecting any electrical connectivity of the substrate 508.

In this example, the first back side 222(2) of the first electrical device 202(1) is coupled to the second front side 530(1) of the second spacer 502(2) through the adhesive layer 430, which may be an adhesive film or adhesive material, provided between the first electrical device 202(1) and second spacer 502(2). The second spacer 502(2), not being an electrical device, does not have second metal interconnects 426 that would be interfered by the adhesive layer 430. Alternatively, the first back side 222(2) of the first electrical device 202(1) could be directly coupled to the second front side 530(1) of the second spacer 502(2), such as through a compression bond.

Note that in this example, although the first electrical device 202(1) and the second spacer 502(2) are shown as having the same width $W_1$ in the cavity 212, such is not required. The first electrical device 202(1) and second spacer 502(2) can have varying, different widths. Further, the width $W_1$ of the first electrical device 202(1) and the second spacer 502(2) in the second, horizontal direction (X-axis direction) do not have to extend to the full width $W_2$ of the cavity 212. Filler material 236(1), 236(2), such as the insulating material (e.g., resin material) used to form the insulating material of the first metallization layer 206(1) and/or the second metallization layer 216(1) on the core 200 can also be used to fill in any smaller voids in the second, horizontal direction (X-axis direction) when the first metallization layer 206(1) and/or the second metallization layer 216(1) are fabricated on the core 200.

Figure 6:
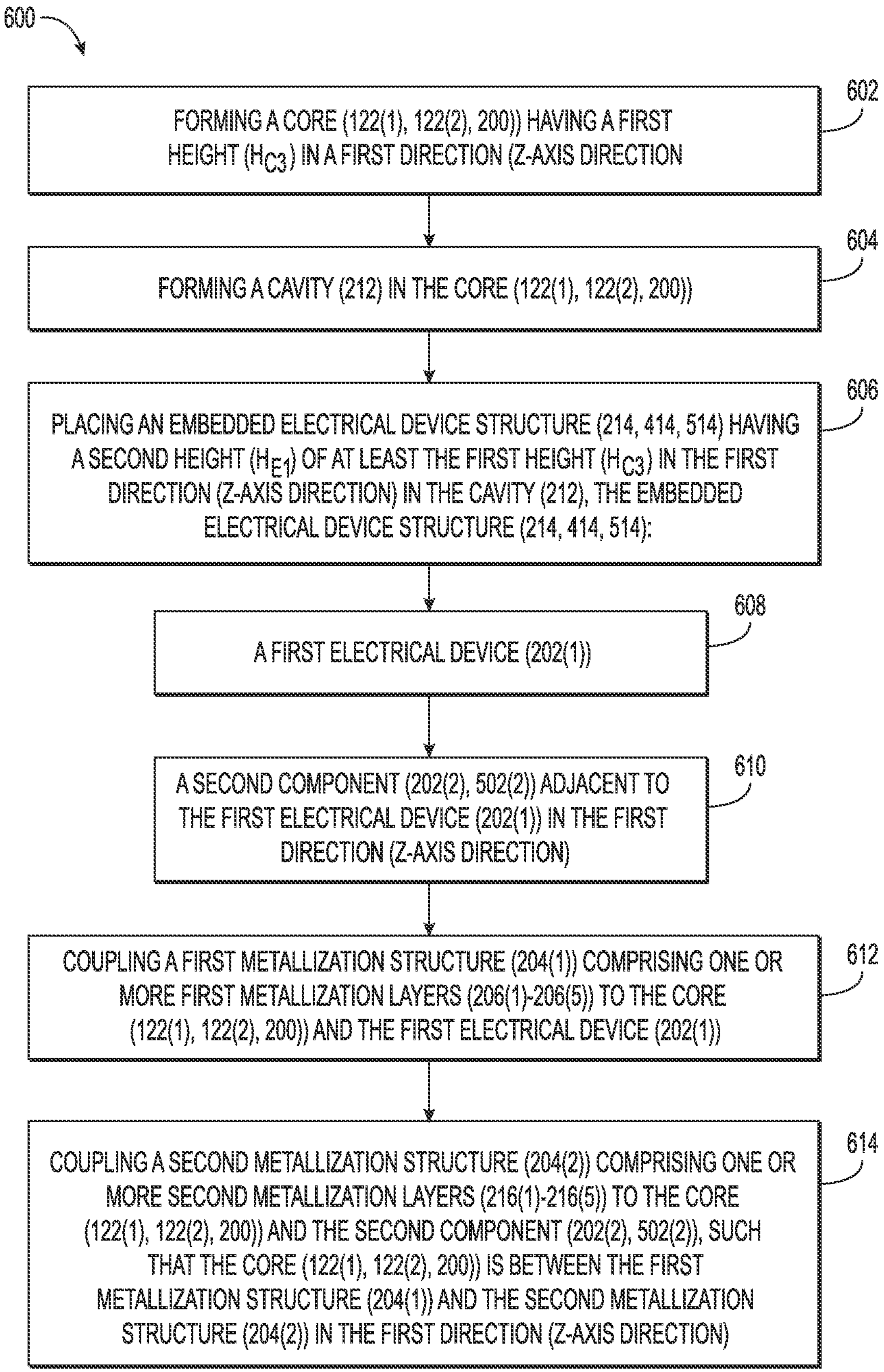
FIG. 6 is a flowchart illustrating an exemplary fabrication process of fabricating a substrate that includes a core with a cavity(ies) formed therein that includes an embedded electrical device structure of an electrical device built upon another second component(s) to make the overall height of the embedded electrical device structure compatible with the height of the cavity of the core, including, but not limited to, the substrates in FIGS. 1, 2, 4, and 5.

FIG. 6 is a flowchart illustrating an exemplary fabrication process 600 of fabricating a substrate that includes a core layer with a cavity(ies) formed therein that includes an embedded electrical device structure of an electrical device built upon another second component(s) to make the overall height of the embedded electrical device structure compatible with the height of the cavity of the core layer, including, but not limited to, the substrates 108(1), 108(2), 208, 408, 508 in FIGS. 1, 2, 4, and 5. The fabrication process 600 in FIG. 6 is discussed with reference to each of the substrates 108(1), 108(2), 208, 408, 508 in FIGS. 1, 2, 4, and 5.

In this regard, a first step in the fabrication process 600 can be forming a core 122(1), 122(2), 200 having a first height $H_{C3}$ in a first direction (Z-axis direction) (block 602 in FIG. 6). A next step in the fabrication process 600 can be forming a cavity 212 in the core 122(1), 122(2), 200 (block 604 in FIG. 6). A next step in the fabrication process 600 can be placing the embedded electrical device structure 214, 414, 514 having a second height $H_{E1}$ of at least the first height $H_{C3}$ in the first direction (Z-axis direction) in the cavity 212 (block 606 in FIG. 6). The embedded electrical device structure 214, 414, 514 has a first electrical device 202(1) (block 608 in FIG. 6), and a second component 202(2), 502(2) adjacent to the first electrical device 202(1) in the first direction (Z-axis direction) (block 610 in FIG. 6). A next step in the fabrication process 600 can be coupling a first metallization structure 204(1) comprising one or more first metallization layers 206(1)-206(5) to the core 122(1), 122(2), 200 and the first electrical device 202(1) (block 612 in FIG. 6). A next step in the fabrication process 600 can be coupling a second metallization structure 204(2) comprising one or more second metallization layers 216(1)-216(5) to the core 122(1), 122(2), 200 and the second component 202(2), 502(2) such that the core 122(1), 122(2), 200 is between the first metallization structure 204(1) and the second metallization structure 204(2) in the first direction (Z-axis direction) (block 614 in FIG. 6).

Other assembly and fabrication processes can be employed to assemble and/or fabricate a substrate that includes a core layer with a cavity(ies) formed therein that includes an embedded electrical device structure of an electrical device built upon another second component(s) to make the overall height of the embedded electrical device structure compatible with the height of the cavity of the core layer, including, but not limited to, the substrates 108(1), 108(2), 208, 408, 508 in FIGS. 1, 2, 4, and 5.

Figure 7:
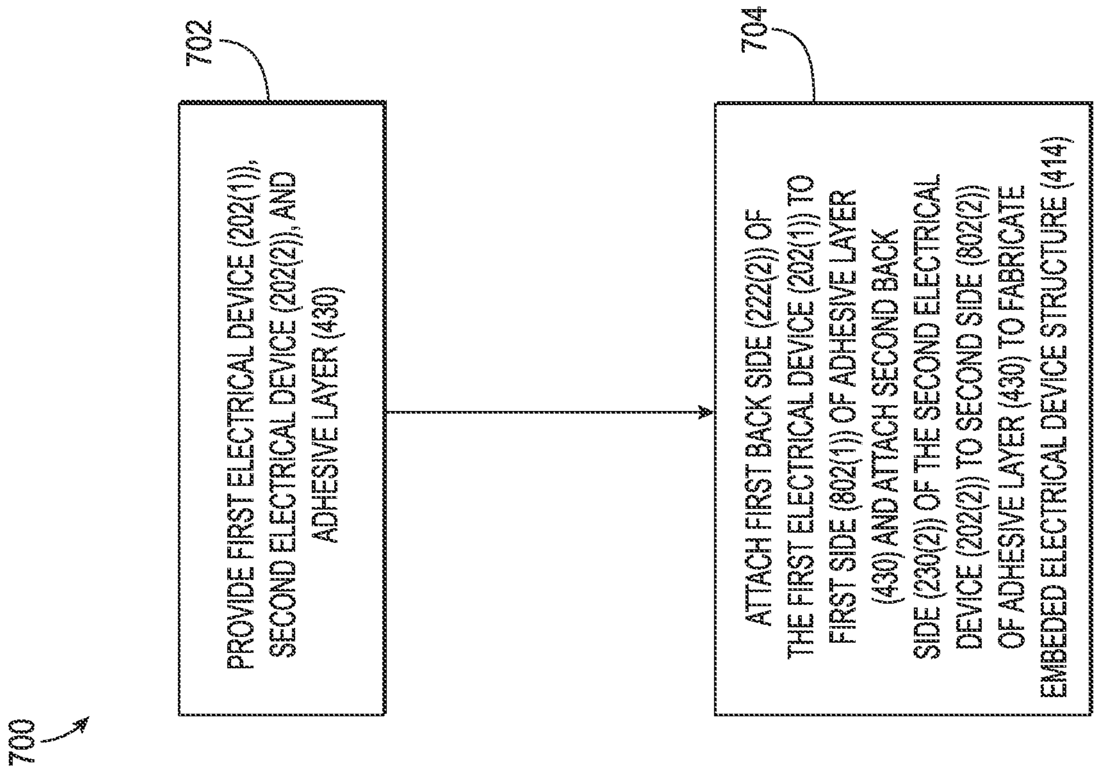
FIG. 7 is a flowchart illustrating an exemplary assembly process of assembling an embedded electrical device structure including, but not limited to, the electrical device structures embedded in a cavity in the core in the substrates in FIGS. 1, 2, 4, and 5.

In this regard, FIG. 7 is a flowchart illustrating an exemplary assembly process 700 of assembling an embedded electrical device structure prior to being placed in a cavity of a substrate, such as the cavity 212 in substrates 208, 408, 508 in FIGS. 2, 4, and 5. The assembly process 700 in FIG. 7 is discussed with regard to the embedded electrical device structure 414 in the substrate 408 in FIG. 4, as an example, but note that the assembly process 700 in FIG. 7 is not limited to assembling the embedded electrical device structure 414 in FIG. 4. The assembly process 700 in FIG. 7 could be used to assemble other embedded electrical device structures that are embedded in a cavity of a substrate, including, but not limited to, the cavity 212 in substrates 208, 408, 508 in FIGS. 2, 4, and 5.

Figure 8A:
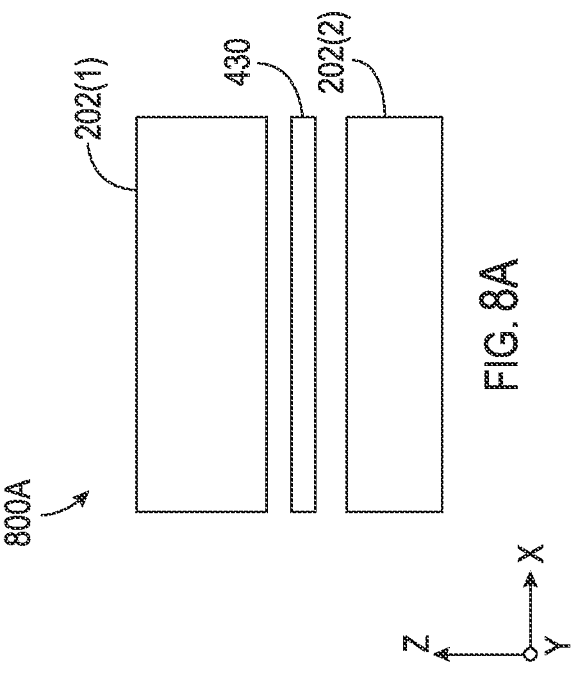
FIGS. 8A and 8B are exemplary assembly stages during assembly of the embedded electrical device structure according to the assembly process in FIG. 7.
Figure 8B:
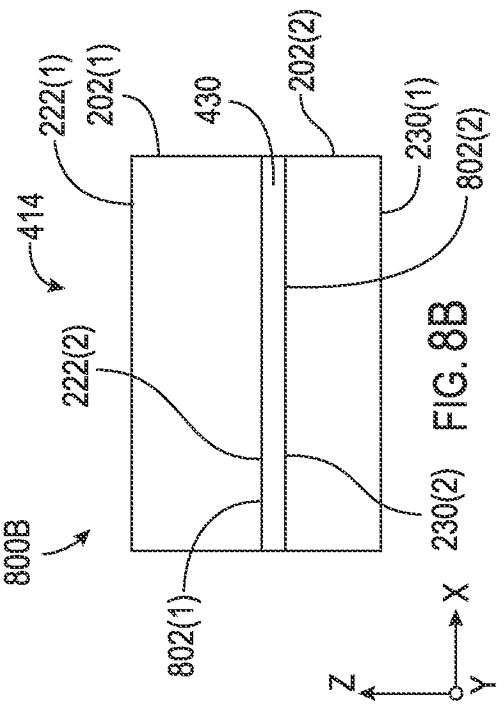

FIGS. 8A and 8B are exemplary assembly stages 800A, 800B during assembly of the embedded electrical device structure 414 according to the assembly process 700 in FIG. 7. The assembly process 700 will be discussed in conjunction with the assembly stages 800A, 800B in FIGS. 8A and 8B.

In this regard, as shown in assembly stage 800A in FIG. 8, a first step in the assembly process 700 can be to provide the first electrical device 202(1), the second electrical device 202(2) and the adhesive layer 430 (block 702 in FIG. 7). The adhesive layer 430 will be used to couple and secure the first electrical device 202(1) to the second electrical device 202(2) to form the embedded electrical device structure as shown in the assembly stage 800B in FIG. 8B (block 704 in FIG. 7). In this example, the first back side 222(2) of the first electrical device 202(1) and the first front side 230(1) of the second electrical device 202(2) are coupled to the adhesive layer 430. For example, the adhesive layer may be a die attach film (DAF). In this example, because the first and second electrical devices 202(1), 202(2) are coupled together in a back-to-back formation, the first back side 222(2) of the first electrical device 202(1) is coupled to a first side 802(1) of the adhesive layer 430 as shown in the assembly stage 800B in FIG. 8B. The second back side 230(2) of the second electrical device 202(2) is coupled to a second side 802(2) of the adhesive layer 430 opposite the first side 802(1) in the first, vertical direction (Z-axis direction) to assemble the embedded electrical device structure 414, as shown in the assembly stage 800B in FIG. 8B.

The assembly process 700 for assembling the embedded electrical device structure 414 in FIG. 7 may be performed separately from the fabrication of the substrate with a core in which the embedded electrical device structure 414 is embedded. For example, it may be advantageous for one party to fabricate and assemble the first and second electrical devices 202(1), 202(2) and another party to fabricate the substrate with a core in which the embedded electrical device structure 414 is embedded.

FIGS. 9A-9D-3 are flowcharts illustrating exemplary respective fabrication processes 900(1)-900(3) of fabricating a substrate that includes a core layer with a cavity(ies) formed therein that includes an embedded electrical device structure of an electrical device built upon another second component(s) to make the overall height of the embedded electrical device structure compatible with the height of the cavity of the core layer, including, but not limited to, the substrates 108(1), 108(2), 208, 408, 508 in FIGS. 1, 2, 4, and 5.

FIGS. 9A, 9B-1, 9C-1, and 9D-1 is a flowchart illustrating an exemplary fabrication process 900(1) of fabricating the substrate 208 in FIG. 2 that includes an embedded electrical device structure 214 with the first and second electrical devices 202(1), 202(2) oriented in a back-to-front configuration. FIGS. 10A-10B, 10C-1, 10D-1, 10E-1, 10F-1, 10G-1, and 10H-1 are exemplary fabrication stages 1000A, 1000B, 1000C-1, 1000D-1A, 1000D-1B, 1000E-1, 1000F-1, 1000G-1, and 1000H-1 during fabrication of the substrate 208 in FIG. 2 according to the fabrication process 900(1) in FIGS. 9A, 9B-1, 9C-1, and 9D-1. The fabrication process 900(1) will now be discussed in conjunction with the fabrication stages 1000A, 1000B, 1000C-1, 1000D-1A, 1000D-1B, 1000E-1, 1000F-1, 1000G-1, and 1000H-1 in FIGS. 10A-10B, 10C-1, 10D-1, 10E-1, 10F-1, 10G-1, and 10H-1.

Figure 9A:
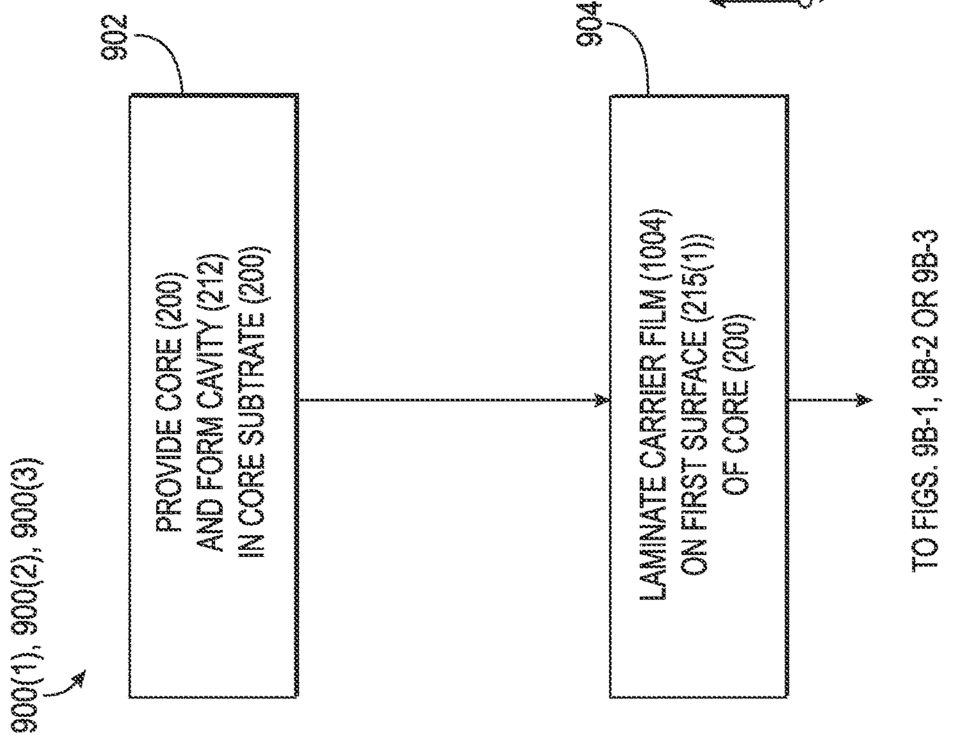
FIG. 9A is a flowchart illustrating another exemplary partial fabrication process of fabricating a substrate that includes a core with a cavity formed therein that includes an embedded electrical device structure of a first electrical device coupled to a second electrical device in a back-to-front configuration to make the overall height of the embedded electrical device structure compatible with the height of the cavity of the core, including, but not limited to, the substrates in FIGS. 1 and 2.
Figure 10A:
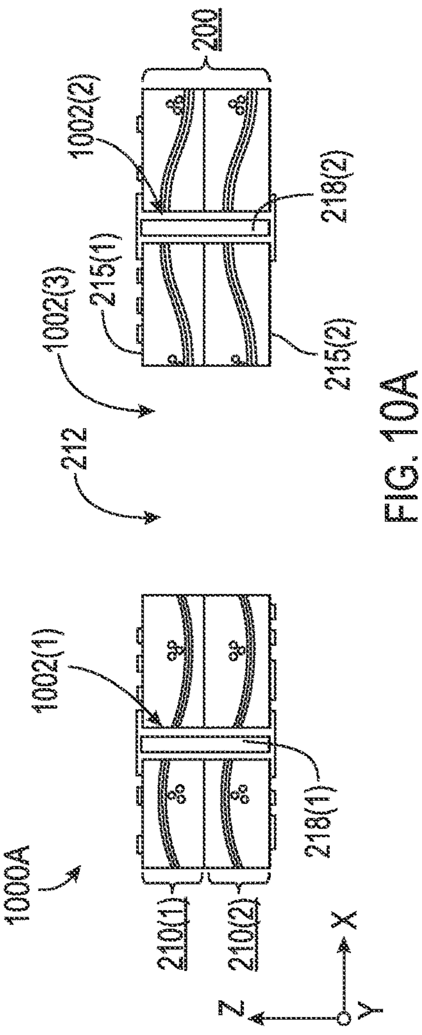
FIGS. 10A-10B are exemplary fabrication stages during fabrication of the substrate according to the fabrication process in FIG. 9A.

In this regard, as shown in the exemplary fabrication stage 1000A in FIG. 10A, a first step in the fabrication process 900(1) can be to provide the core 200 that includes the first and second core layers 210(1), 210(2) in this example coupled to each other (block 902 in FIG. 9A). The cavity 212 is formed in the core 200 to prepare the embedded electrical device structure 214 to be embedded therein (block 902 in FIG. 9A). The first and second vertical interconnects 218(1), 218(2) are formed through the core 200 in the first, vertical direction (Z-axis direction) from the first surface 215(1) of the core 200 to the second surface 215(2) of the core 200. For example, the first and second vertical interconnects 218(1), 218(2) may be formed by drilling first and second openings 1002(1), 1002(2) through the core 200 and filling the openings with a metal material to form the first and second vertical interconnects 218(1), 218(2). The cavity 212 is also formed through the core 200 in the first, vertical direction (Z-axis direction) from the first surface 215(1) of the core 200 to the second surface 215(2) of the core 200. For example, the cavity 212 may also be formed by drilling a third opening 1002(3) through the core 200 and filling the opening with a metal material to form the first and second vertical interconnects 218(1), 218(2).

Figure 10B:
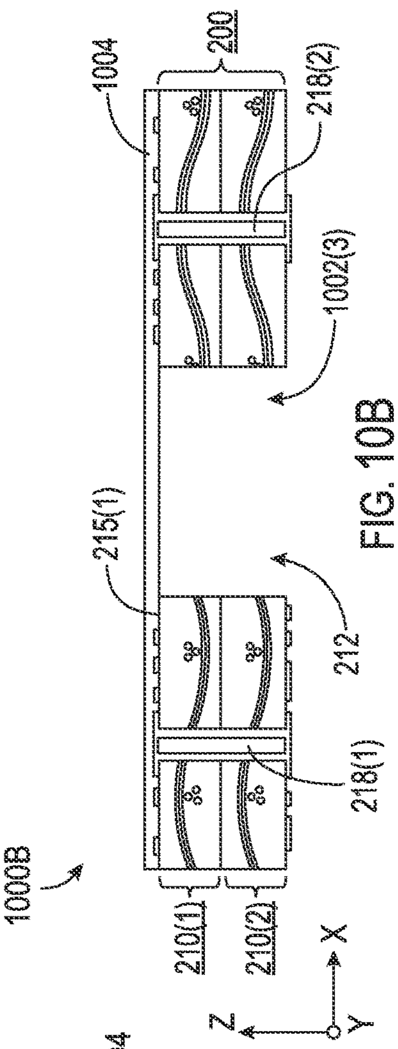

Then, as shown in the exemplary fabrication stage 1000B in FIG. 10B, a next step in the fabrication process 900(1) can be to laminate a temporary carrier film 1004 on the first surface 215(1) of the core 200 (block 904 in FIG. 9A). This is to provide a structure in which the embedded electrical device structure 214 can be coupled to and secured within the cavity 212 as part of embedding the embedded electrical device structure 214 in the cavity 212. For example, the carrier film 1004 may be a polyimide film and have an adhesive function that will stick to the embedded electrical device structure 214 placed in contact therewith.

Figures 1, 9B:
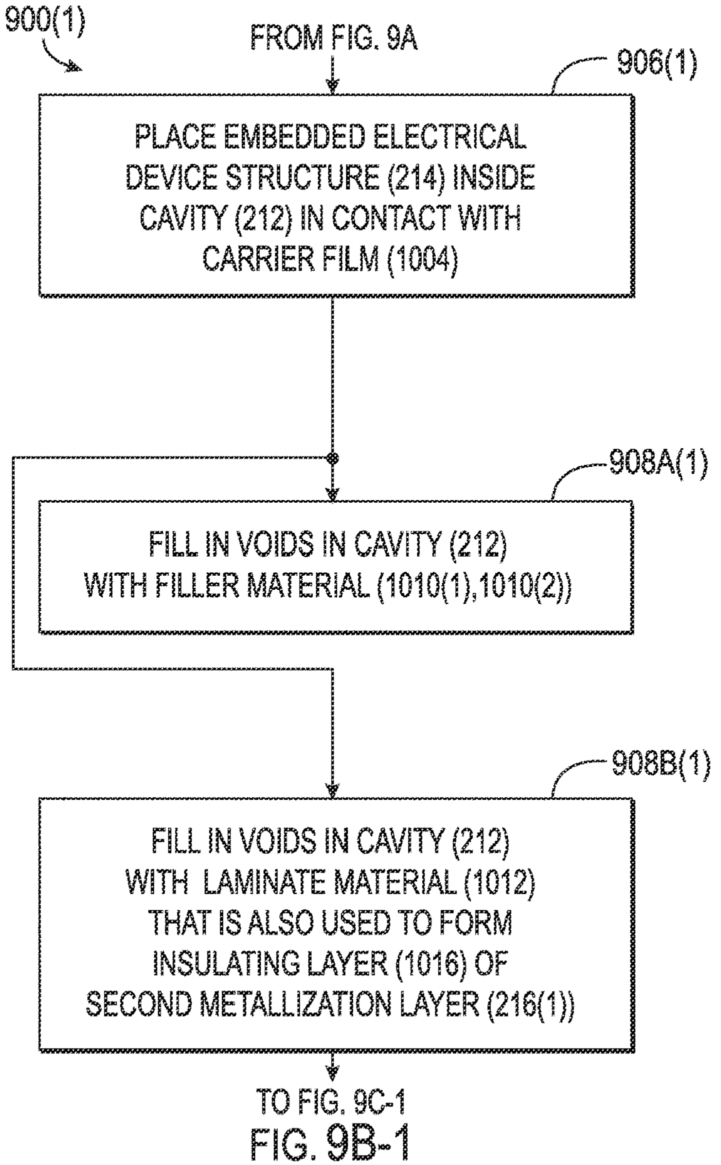
Figures 1, 10C:
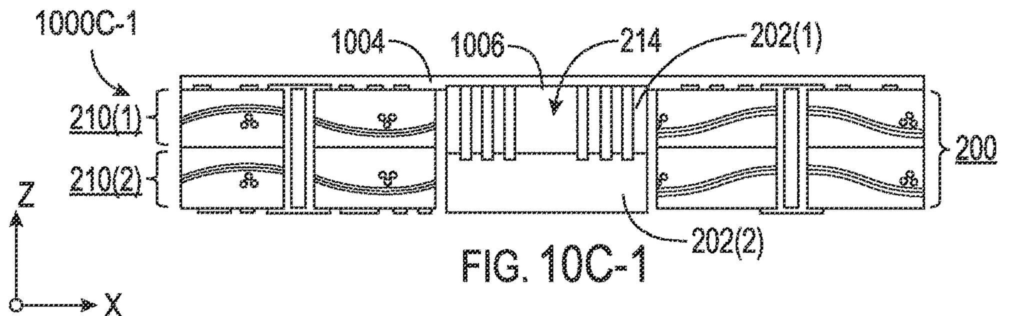

Then, as shown in the exemplary fabrication stage 1000C-1 in FIG. 10C-1, a next step in the fabrication process 900(1) can be to place the embedded electrical device structure 214 (which, for example, may have been assembled according to the assembly process 700 in FIG. 7) in the cavity 212 and in contact with an underside surface 1006 of the carrier film 1004 within the cavity 212 (block 906(1) in FIG. 9B-1). This is to temporarily secure the embedded electrical device structure 214 in the cavity 212 until the cavity 212 can be sealed with the embedded electrical device structure 214 embedded therein.

Figures 1A, 10D:
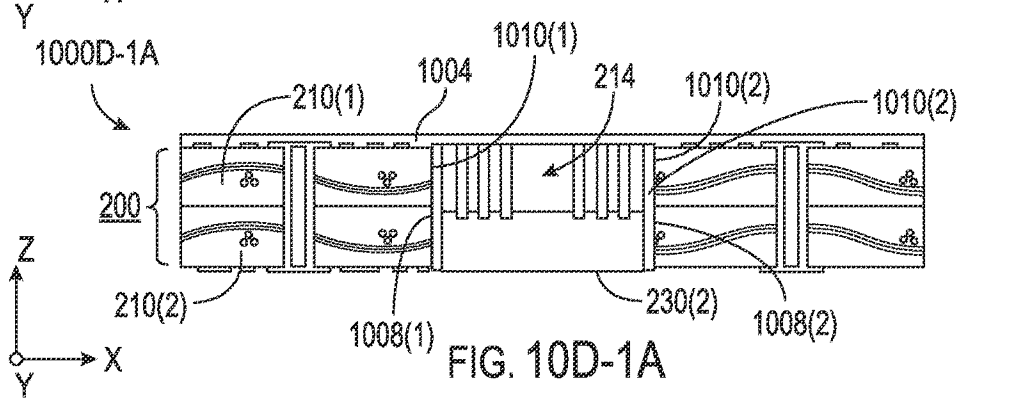
Figures 1B, 10D:
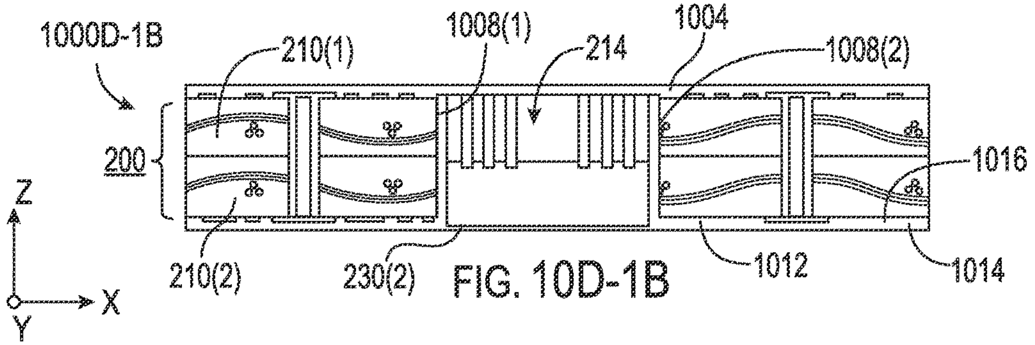

Then, as one option, as shown in the exemplary fabrication stage 1000D-1A in FIG. 10D-1A, a next step in the fabrication process 900(1) can be to fill in smaller voids between the embedded electrical device structure 214 and inside walls 1008(1), 1008(2) in the second, horizontal direction (X-axis direction) to secure the embedded electrical device structure 214 with the cavity 212 (block 908A(1) in FIG. 9A). For example, a filler material 1010(1), 1010(2) can be filled in the voids in the cavity 212 between the embedded electrical device structure 214 and the inside walls 1008(1), 1008(2) in the second, horizontal direction (X-axis direction) to the underside surface 1006 of the carrier film 1004. The filler material 1010(1), 1010(2) can be any material that can be disposed in the voids of the cavity 212, including a polymer material for example. The filler material 1010(1), 1010(2) could also be provided in the form of a plug that is shaped to conform to the void to be filled, wherein the plug is made from a filler material. As another alternative option, as shown in the exemplary fabrication stage 1000D-1B in FIG. 10D-1B, the next step in the fabrication process 900(1) could be to fill in smaller voids between the embedded electrical device structure 214 and the inside walls 1008(1), 1008(2) in the second, horizontal direction (X-axis direction) with the same laminate material 1012 as used to form a build-up laminate layer 1014 on the second surface 215(2) of the core 200 (block 908B(1) in FIG. 9B-1). This laminate layer 1014 also provides a second insulating layer 1016 in which a second metallization layer 216(1) will be formed as part of the second metallization structure 204(2) (see FIG. 2). Because the second electrical device 202(2) is provided as part of the embedded electrical device structure 214 in the cavity 212, the second back side 230(2) of the second electrical device 202(2) provides a firm surface on which the laminate layer 1014 can be disposed and undulation of the laminate layer 1014 can be reduced or avoided in the area of the cavity 212.

Figures 1, 9C:
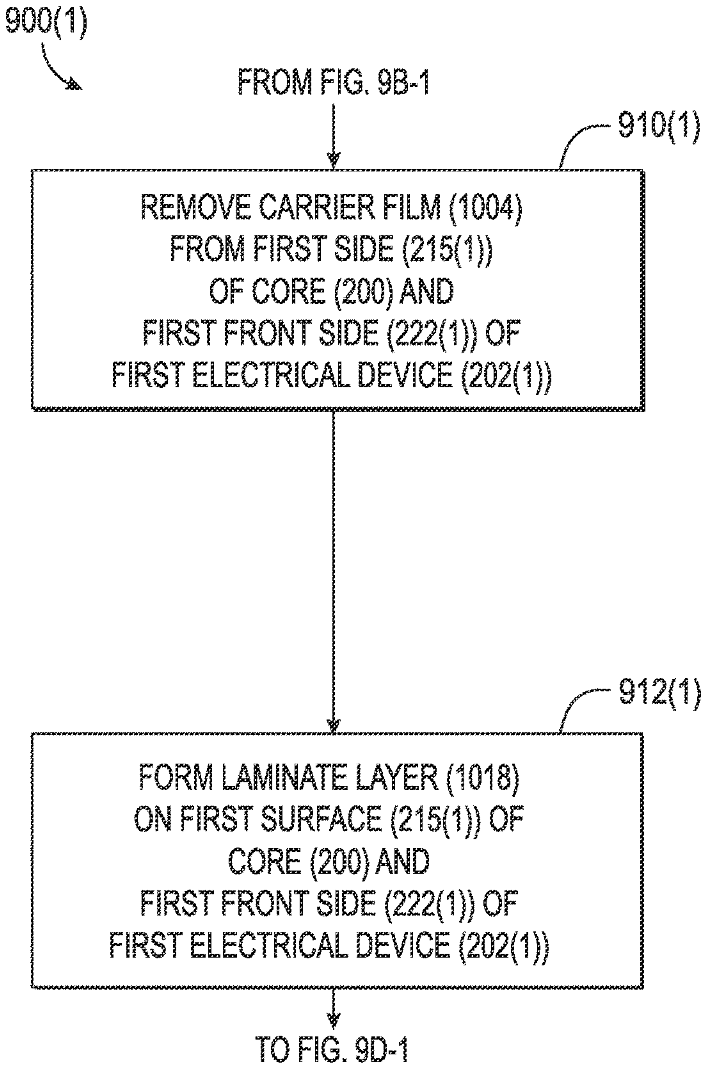
Figures 1, 10E:
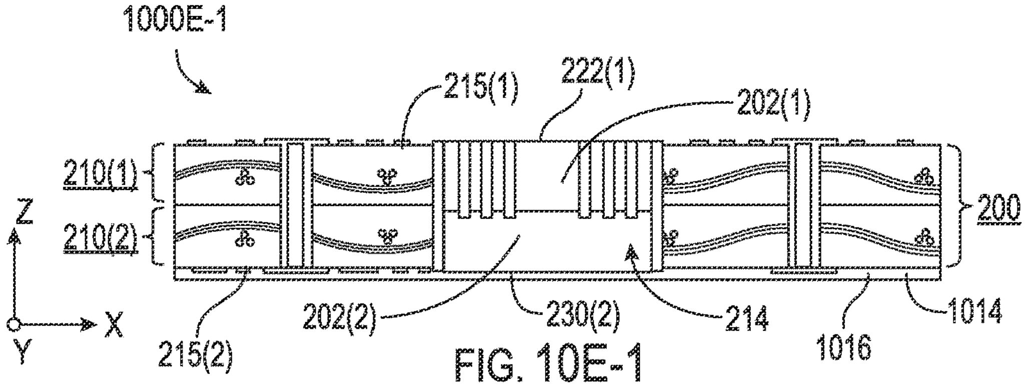

Then, as shown in the exemplary fabrication stage 1000E-1 in FIG. 10E-1, a next step in the fabrication process 900(1) can be to remove the temporary carrier film 1004 from the first surface 215(1) of the core 200 that is also coupled to the first front side 222(1) of the first electrical device 202(1) of the embedded electrical device structure 214 (block 910(1) in FIG. 9C-1). The second back side 230(2) of the second electrical device 202(2) of the embedded electrical device structure 214 is secure in the cavity 212 due to the presence of the bottom laminate layer 1014 on the second surface 215(2) of the core 200. If the first option of using the filler material 1010(1), 1010(2) as shown in fabrication stage 1000D-1A in FIG. 10D-1A was used to fill the voids in the cavity 212, the fabrication stage 1000E-1 in FIG. 10E-1 can also involve forming the laminate layer 1014 on the second surface 215(2) of the core 200 adjacent to the second back side 230(2) of the second electrical device 202(2) of the embedded electrical device structure 214.

Figures 1, 10F:
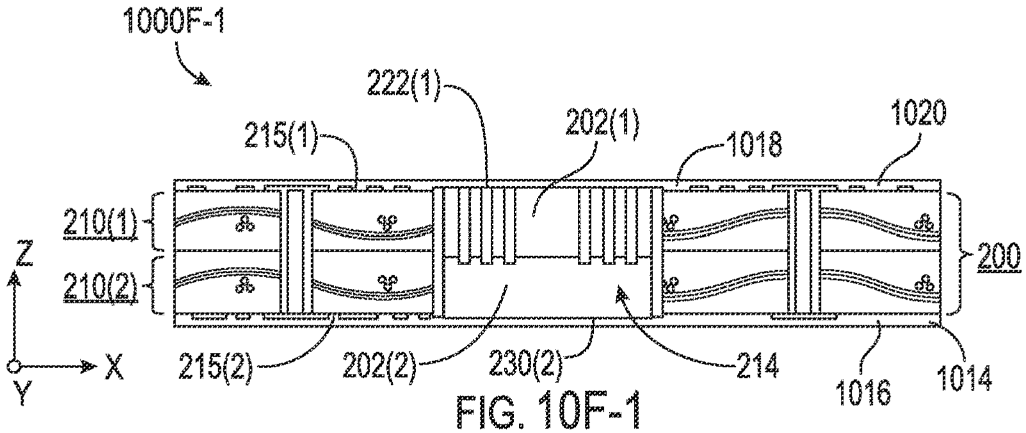

Then, as shown in the exemplary fabrication stage 1000F-1 in FIG. 10F-1, a next step in the fabrication process 900(1) can be to form a laminate layer 1018 on the first surface 215(1) of the core 200 and in contact with the front first side 222(1) of the first electrical device 202(1) of the embedded electrical device structure 214 (block 912(1) in FIG. 9C-1). The laminate layer 1018 will become the first insulating layer 1020 for the first metallization layer 206(1) of the first metallization structure 204(1) (FIG. 2). Because the first electrical device 202(1) is provided as part of the embedded electrical device structure 214 in the cavity 212, the first front side 222(1) of the first electrical device 202(1) provides a firm surface on which the laminate layer 1018 can be disposed and undulation of the laminate layer 1018 can be reduced or avoided in the area of the cavity 212.

Figures 1, 9D:
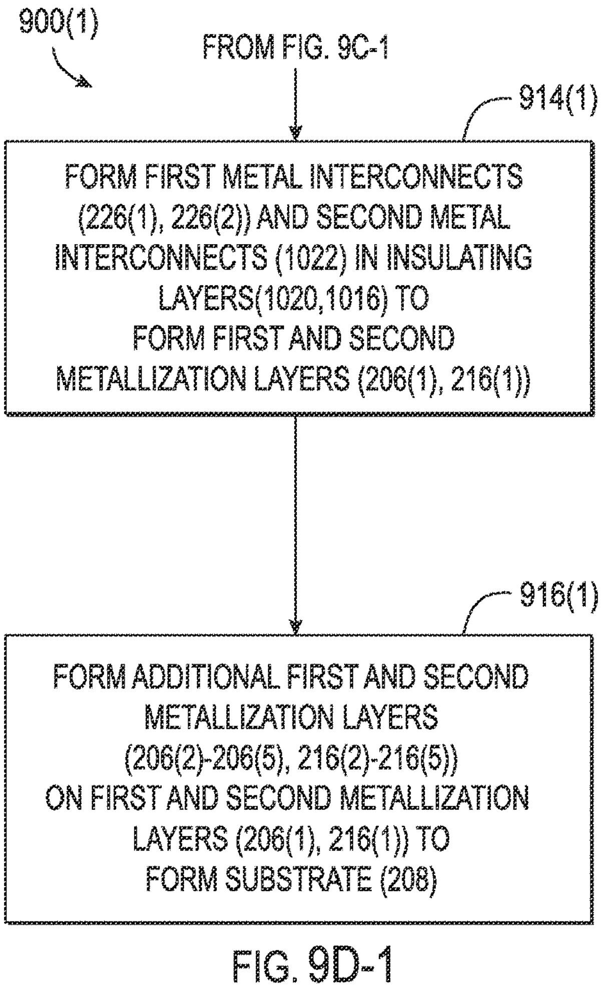
Figures 1, 10G:
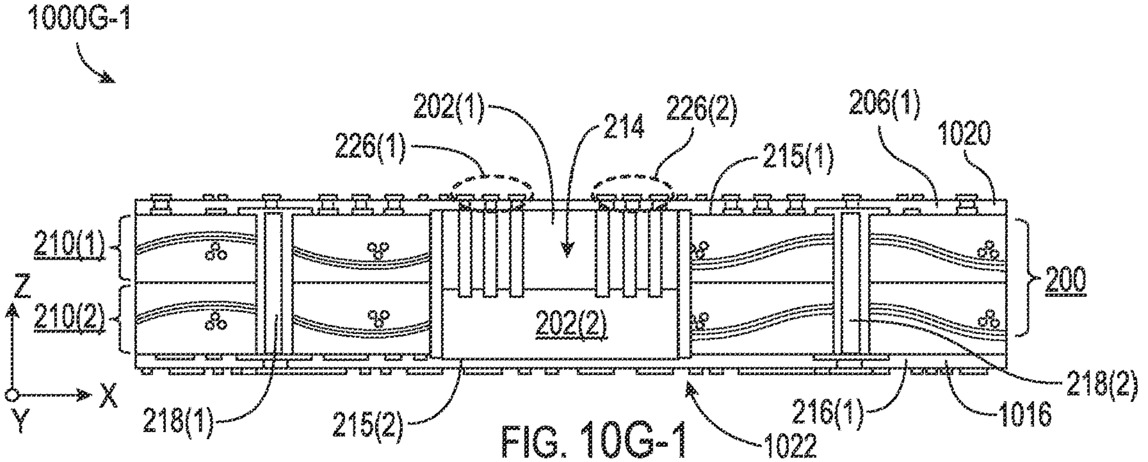
Figures 1, 10H:
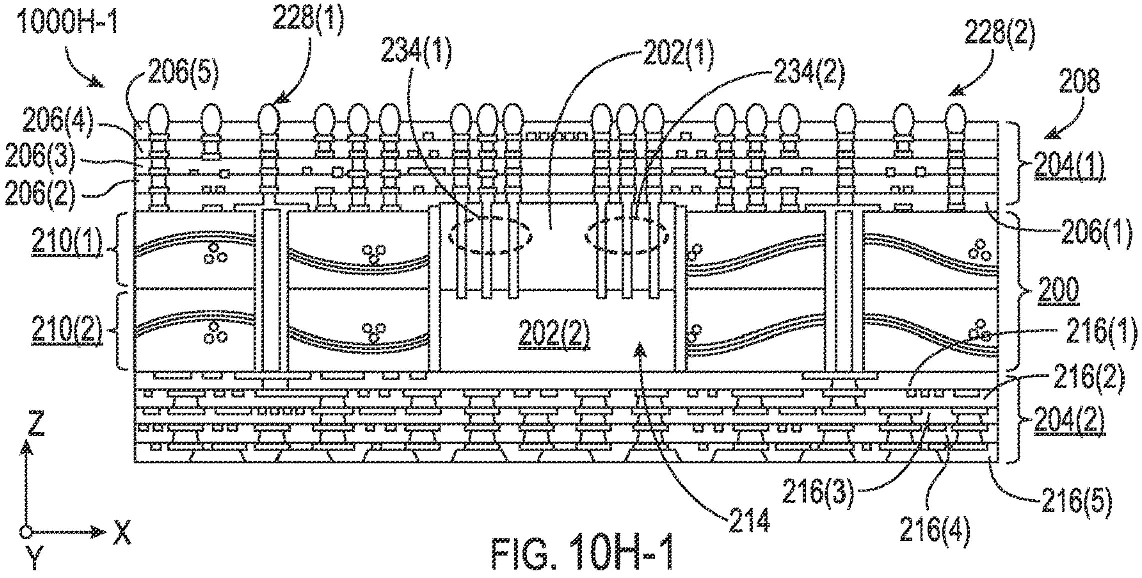
Figures 2, 9B:
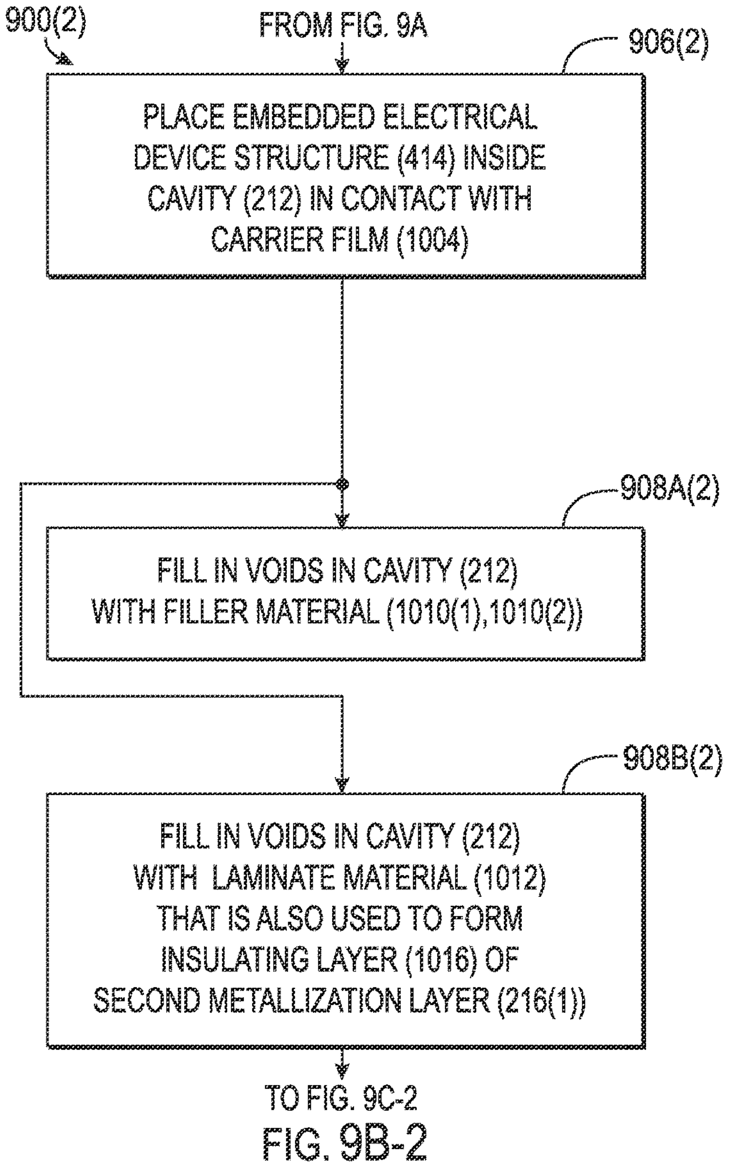
Figures 2, 10C:
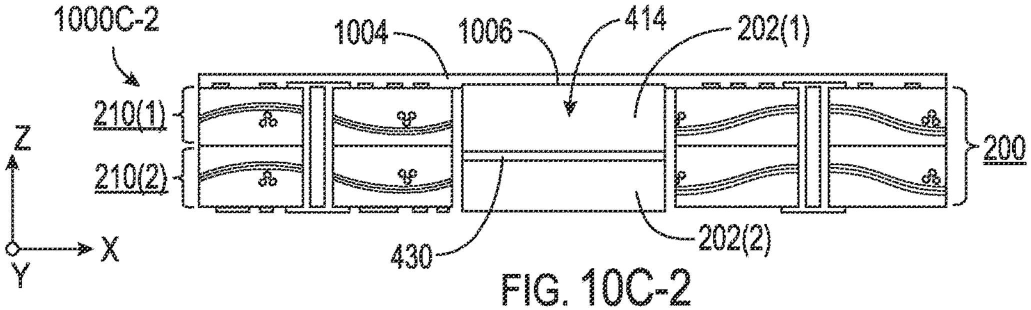

Then, as shown in the exemplary fabrication stage 1000G-1 in FIG. 10G-1, a next step in the fabrication process 900(1) can be to form the first metal interconnects 226(1), 226(2) in the first insulating layer 1020 to form the first metallization layer 206(1), and form second metal interconnects 1022 in the second insulating layer 1016 to form the second metallization layer 216(1) (block 914(1) in FIG. 9D-1). Then, as shown in the exemplary fabrication stage 1000H-1 in FIG. 10H-1, a next step in the fabrication process 900(1) can be to form the additional first and second metallization layers 206(2)-206(5), 216(2)-216(5) on the respective first and second metallization layers 206(1), 216(1) to form the substrate 208 (block 916(1) in FIG. 9D-1).

FIGS. 9A, 9B-2, 9C-2, and 9D-2 is a flowchart illustrating an exemplary fabrication process 900(2) of fabricating the substrate 408 in FIG. 4 that includes an embedded electrical device structure 414 with the first and second electrical devices 202(1), 202(2) oriented in a back-to-back configuration. FIGS. 10A-10B, 10C-2, 10D-2, 10E-2, 10F-2, 10G-2, and 10H-2 are exemplary fabrication stages 1000A, 1000B, 1000C-2, 1000D-2A, 1000D-2B, 1000E-2, 1000F-2, 1000G-2, and 1000H-2 during fabrication of the substrate 408 in FIG. 4 according to the fabrication process 900(2) in FIGS. 9A, 9B-1, 9C-1, and 9D-1. The fabrication process 900(2) will now be discussed in conjunction with the fabrication stages 1000A, 1000B, 1000D-2A, 1000D-2B, 1000E-2, 1000F-2, 1000G-2, and 1000H-2 in FIGS. 10A-10B, 10C-2, 10D-2, 10E-2, 10F-2, 10G-2, and 10H-2.

The fabrication process 900(2) of fabricating the substrate 408 in FIG. 4 also includes the process steps 902 and 904 in FIGS. 9A and 9B, which are discussed above and thus will not be repeated.

Then, as shown in the exemplary fabrication stage 1000C-2 in FIG. 10C-2, a next step in the fabrication process 900(2) can be to place the embedded electrical device structure 414 (which, for example, may have been assembled according to the assembly process 700 in FIG. 7) in the cavity 212 and in contact with the underside surface 1006 of the carrier film 1004 within the cavity 212 (block 906(2) in FIG. 9B-2). This is to temporarily secure the embedded electrical device structure 414 in the cavity 212 until the cavity 212 can be sealed with the embedded electrical device structure 414 embedded therein.

Figures 2A, 10D:
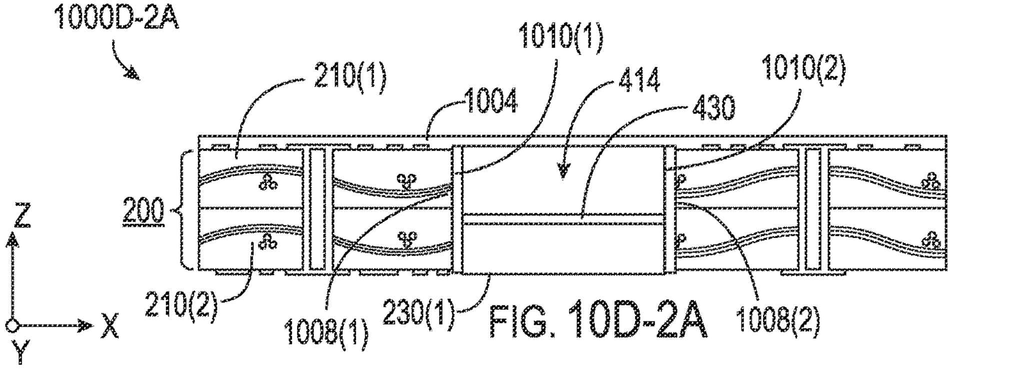
Figures 2B, 10D:
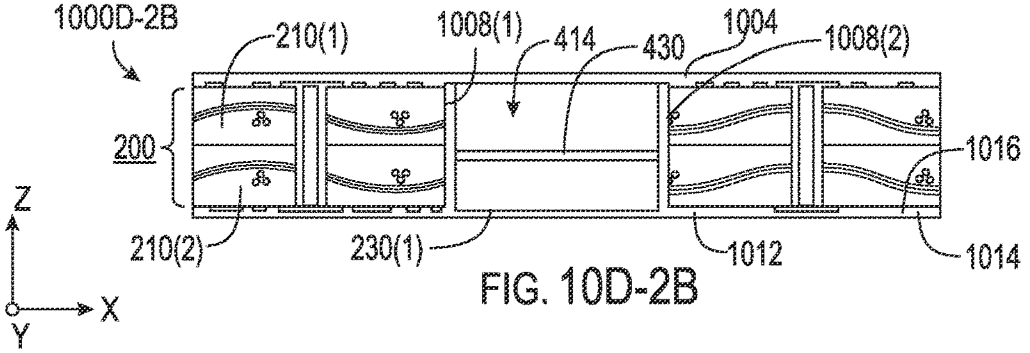
Figures 2, 9C:
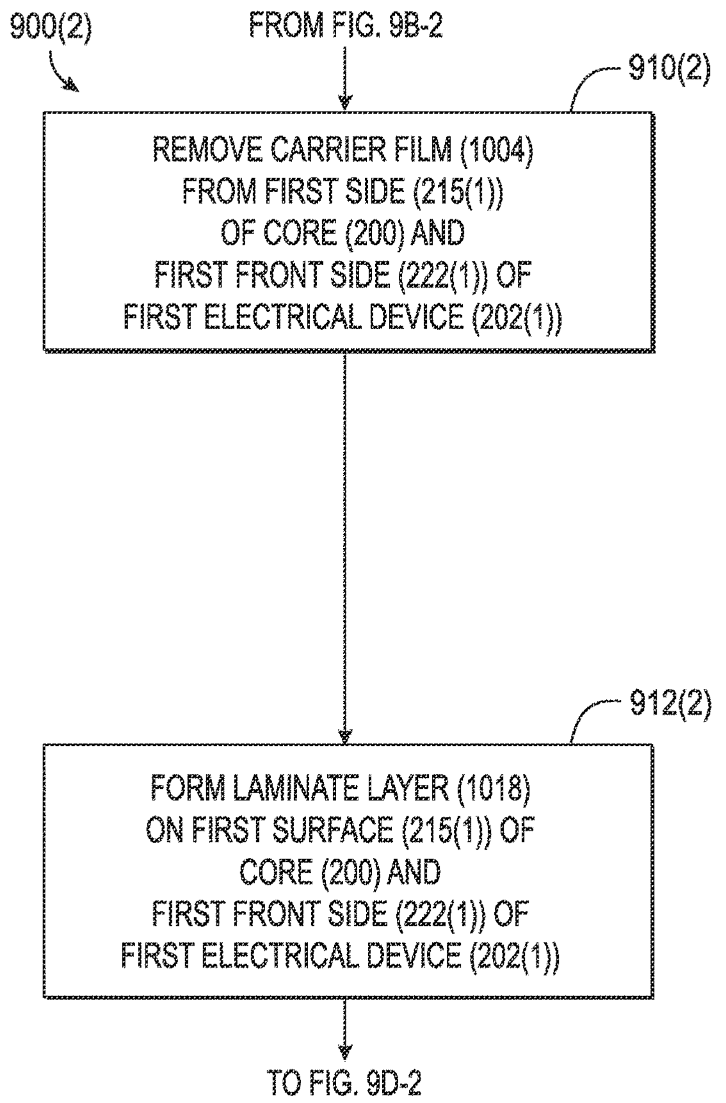
Figures 2, 10E:
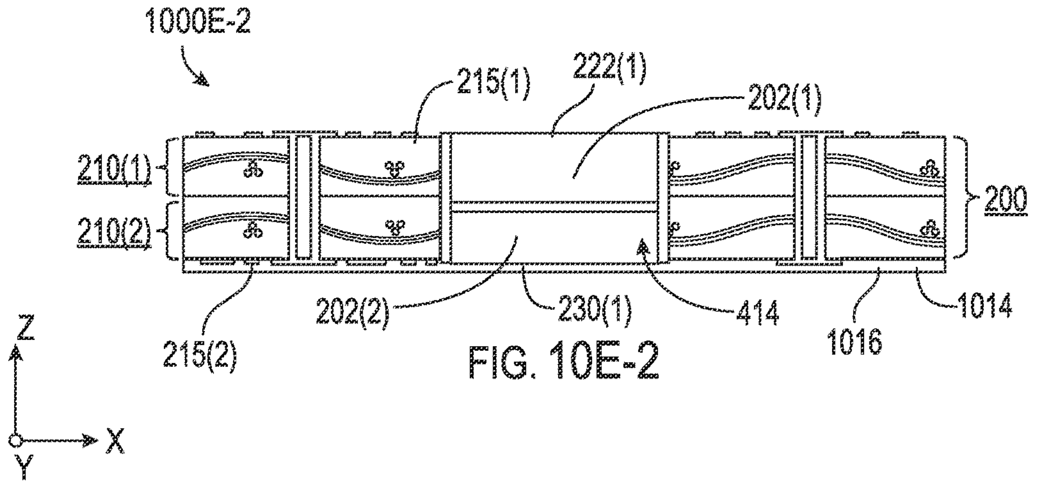
Figures 2, 10F:
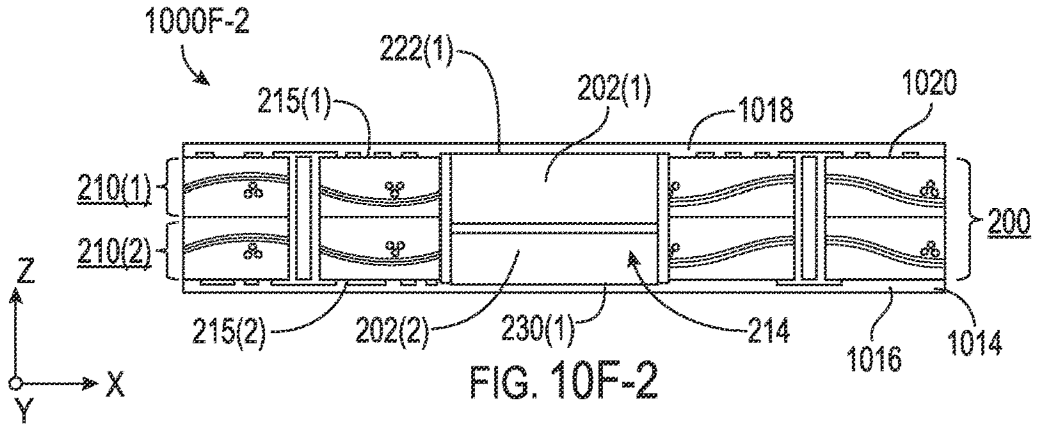
Figures 2, 9D:
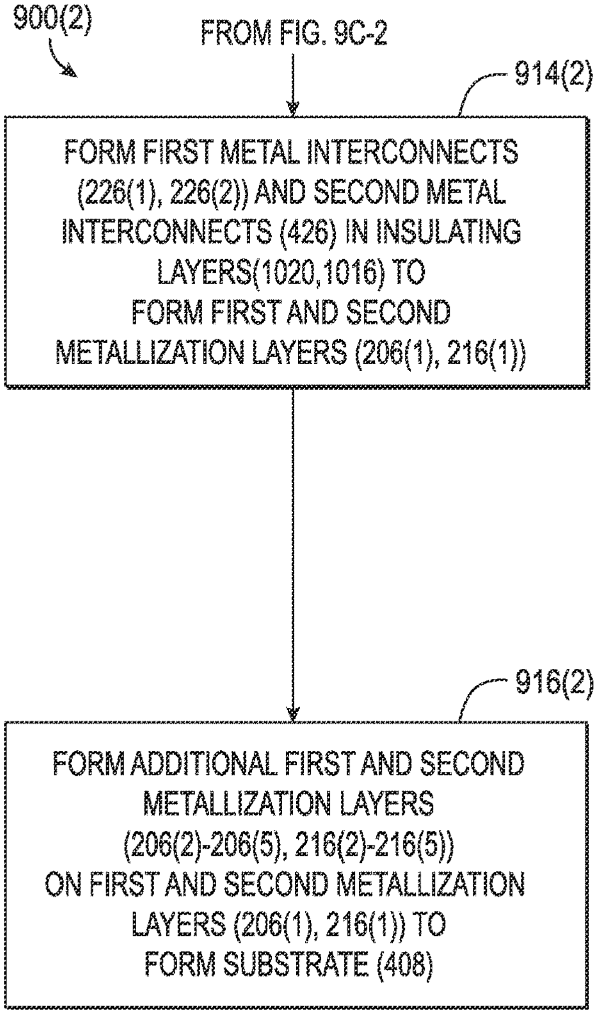
Figures 2, 10G:
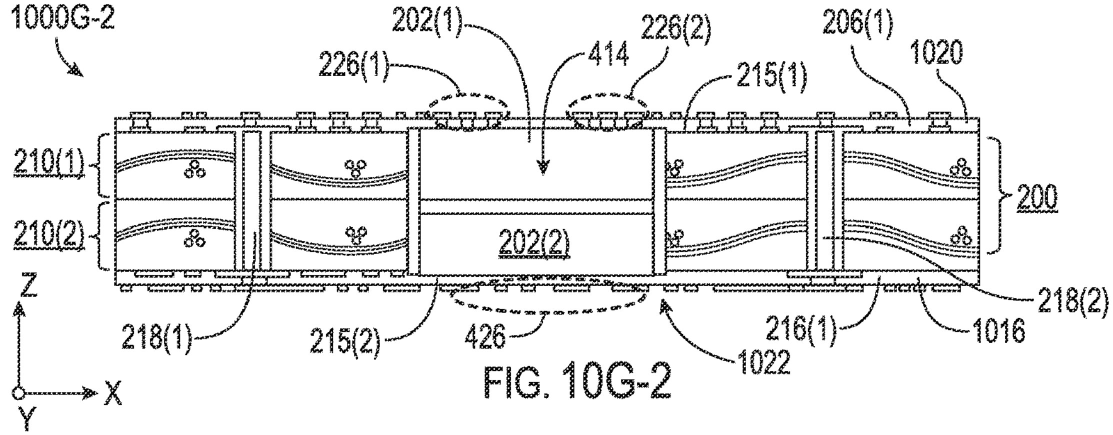
Figures 2, 10H:
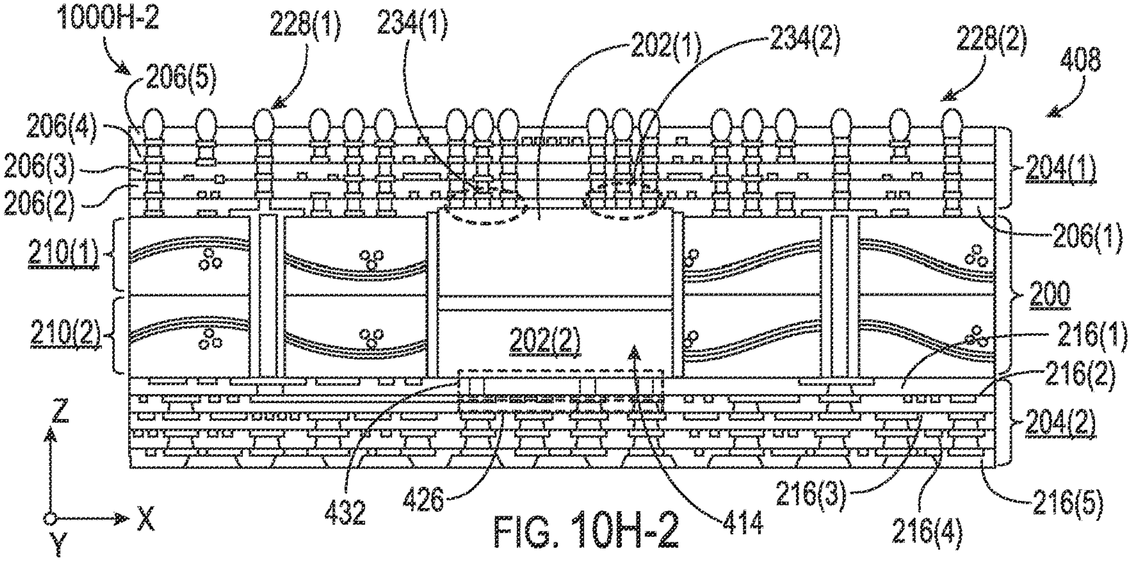
Figures 3, 9B:
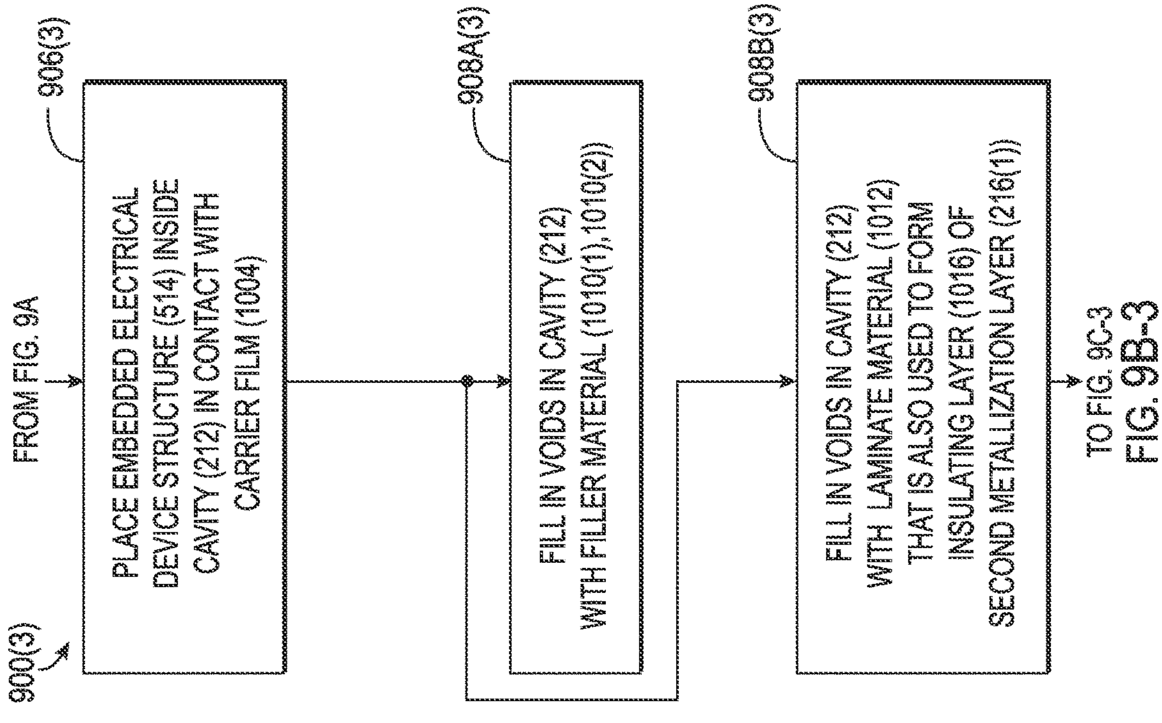
Figures 3, 10C:
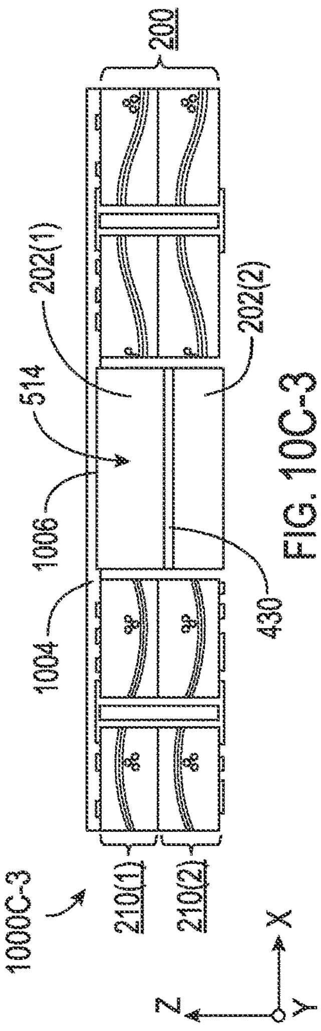

Then, as one option, as shown in the exemplary fabrication stage 1000D-2A in FIG. 10D-2A, a next step in the fabrication process 900(2) can be to fill in smaller voids between the embedded electrical device structure 414 and the inside walls 1008(1), 1008(2) in the second, horizontal direction (X-axis direction) to secure the embedded electrical device structure 414 within the cavity 212 (block 908A (2) in FIG. 9A). For example, a filler material 1010(1), 1010(2) can be filled in the voids in the cavity 212 between the embedded electrical device structure 414 and the inside walls 1008(1), 1008(2) in the second, horizontal direction (X-axis direction) to the underside surface 1006 of the carrier film 1004. As another alternative option, as shown in the exemplary fabrication stage 1000D-2B in FIG. 10D-2B, the next step in the fabrication process 900(2) could be to fill in smaller voids between the embedded electrical device structure 414 and the inside walls 1008(1), 1008(2) in the second, horizontal direction (X-axis direction) with the same laminate material 1012 as used to form a build-up laminate layer 1014 on the second surface 215(2) of the core 200 (block 908B(2) in FIG. 9B-2). This laminate layer 1014 also provides a second insulating layer 1016 in which a second metallization layer 216(1) will be formed as part of the second metallization structure 204(2) (see FIG. 4). Because the second electrical device 202(2) is provided as part of the embedded electrical device structure 414 in the cavity 212, the second front side 230(1) of the second electrical device 202(2) provides a firm surface on which the laminate layer 1014 can be disposed and undulation of the laminate layer 1014 can be reduced or avoided in the area of the cavity 212.

Then, as shown in the exemplary fabrication stage 1000E-2 in FIG. 10E-2, a next step in the fabrication process 900(2) can be to remove the temporary carrier film 1004 from the first surface 215(1) of the core 200 that is also coupled to the first front side 222(1) of the first electrical device 202(1) of the embedded electrical device structure 414 (block 910(2) in FIG. 9C-2). The second front side 230(1) of the second electrical device 202(2) of the embedded electrical device structure 414 is secure in the cavity 212 due to the presence of the bottom laminate layer 1014 on the second surface 215(2) of the core 200. If the first option of using the filler material 1010(1), 1010(2) as shown in fabrication stage 1000D-2A in FIG. 10D-2A was used to fill the voids in the cavity 212, the fabrication stage 1000E-2 in FIG. 10E-2 can also involve forming the laminate layer 1014 on the second surface 215(1) of the core 200 adjacent to the second front side 230(1) of the second electrical device 202(2) of the embedded electrical device structure 414.

Then, as shown in the exemplary fabrication stage 1000F-2 in FIG. 10F-2, a next step in the fabrication process 900(2) can be to form a laminate layer 1018 on the first surface 215(1) of the core 200 and in contact with the front first side 222(1) of the first electrical device 202(1) of the embedded electrical device structure 414 (block 912(2) in FIG. 9C-2). The laminate layer 1018 will become the first insulating layer 1020 for the first metallization layer 206(1) of the first metallization structure 204(1) (FIG. 4). Because the first electrical device 202(1) is provided as part of the embedded electrical device structure 414 in the cavity 212, the first front side 222(1) of the first electrical device 202(1) provides a firm surface on which the laminate layer 1018 can be disposed and undulation of the laminate layer 1018 can be reduced or avoided in the area of the cavity 212.

Then, as shown in the exemplary fabrication stage 1000G-2 in FIG. 10G-2, a next step in the fabrication process 900(2) can be to form the first metal interconnects 226(1), 226(2) in the first insulating layer 1020 to form the first metallization layer 206(1), and form second metal interconnects 1022 in the second insulating layer 1016 to form the second metallization layer 216(1) (block 914(2) in FIG. 9D-2). Then, as shown in the exemplary fabrication stage 1000H-2 in FIG. 10H-2, a next step in the fabrication process 900(2) can be to form the additional first and second metallization layers 206(2)-206(5), 216(2)-216(5) on the respective first and second metallization layers 206(1), 216 (1) to form the substrate 408 (block 916(2) in FIG. 9D-2). The second metal interconnects 426 are formed in the second insulating layer 1016 to form the second metallization layer 216(1), which are then coupled to the second metal interconnects 432 to provide direct electrical connections between the second metallization structure 204(2) and the second electrical device 202(2).

FIGS. 9A, 9B-3, 9C-3, and 9D-3 is a flowchart illustrating an exemplary fabrication process 900(3) of fabricating the substrate 508 in FIG. 5 that includes an embedded electrical device structure 514 with the first electrical device 202(1) and the second spacer 502(2) oriented in a back-to-front configuration. FIGS. 10A-10B, 10C-3, 10D-3, 10E-3, 10F-3, 10G-3, and 10H-3 are exemplary fabrication stages 1000A, 1000B, 1000C-3, 1000D-3A, 1000D-3B, 1000E-3, 1000F-3, 1000G-3, and 1000H-3 during fabrication of the substrate 508 in FIG. 5 according to the fabrication process 900(3) in FIGS. 9A, 9B-3, 9C-3, and 9D-3. The fabrication process 900(3) will now be discussed in conjunction with the fabrication stages 1000A, 1000B, 1000C-3, 1000D-3A, 1000D-3B, 1000E-3, 1000F-3, 1000G-3, and 1000H-3 in FIGS. 10A-10B, 10C-3, 10D-3, 10E-3, 10F-3, 10G-3, and 10H-3.

The fabrication process 900(3) of fabricating the substrate 508 in FIG. 5 also includes the process steps 902 and 904 in FIGS. 9A and 9B, which are discussed above and thus will not be repeated.

Then, as shown in the exemplary fabrication stage 1000C-3 in FIG. 10C-3, a next step in the fabrication process 900(3) can be to place the embedded electrical device structure 514 (which, for example, may have been assembled according to the assembly process 700 in FIG. 7) in the cavity 212 and in contact with the underside surface 1006 of the carrier film 1004 within the cavity 212 (block 906(3) in FIG. 9B-3). This is to temporarily secure the embedded electrical device structure 514 in the cavity 212 until the cavity 212 can be sealed with the embedded electrical device structure 514 embedded therein.

Figures 3A, 10D:
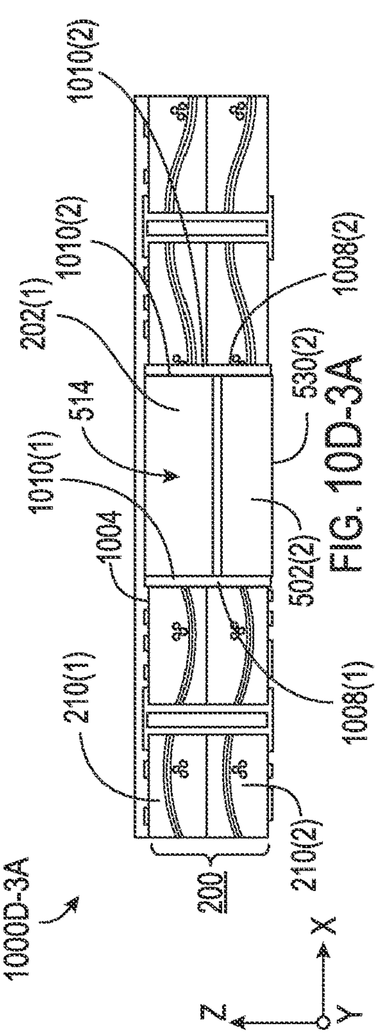
Figures 3B, 10D:
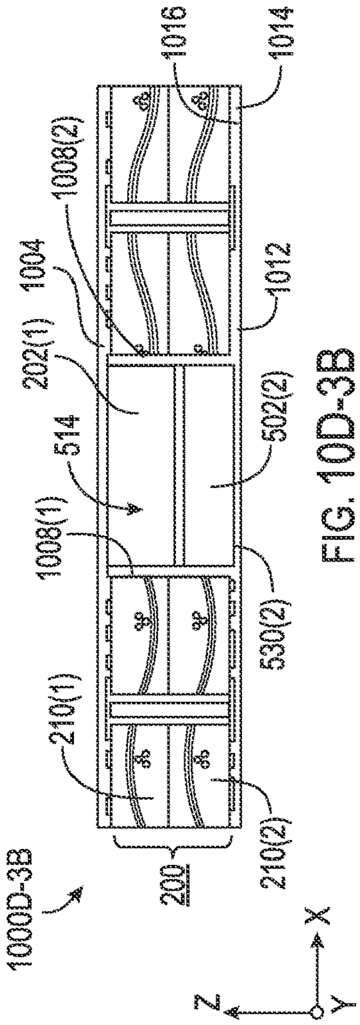
Figures 3, 9C:
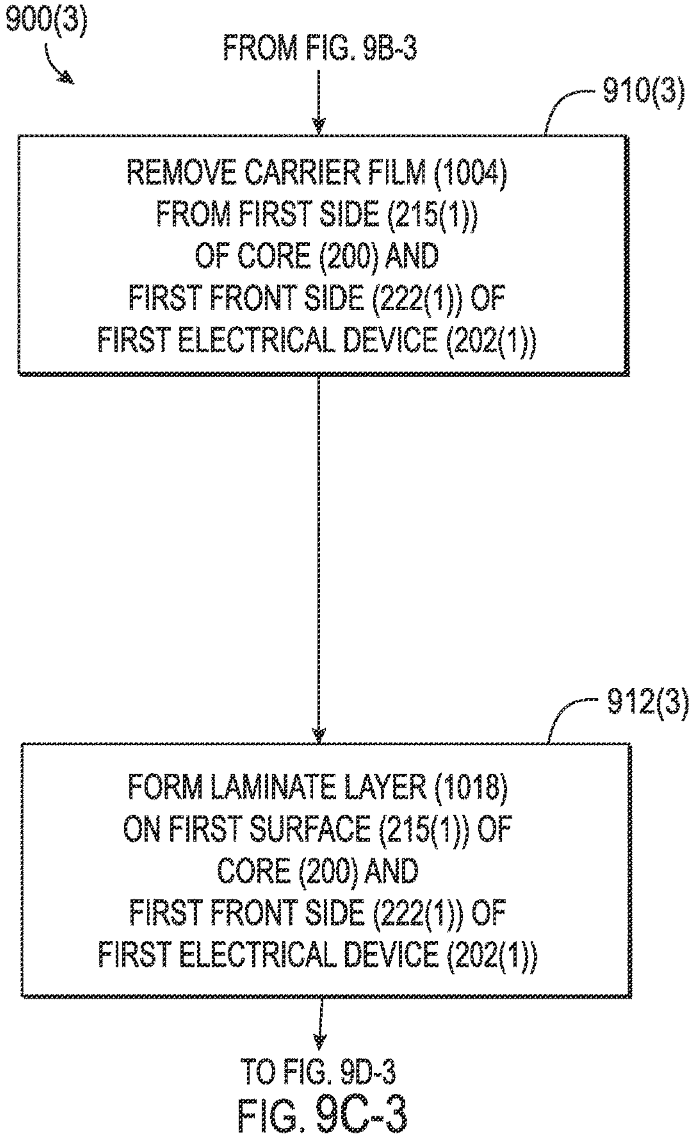
Figures 3, 10E:
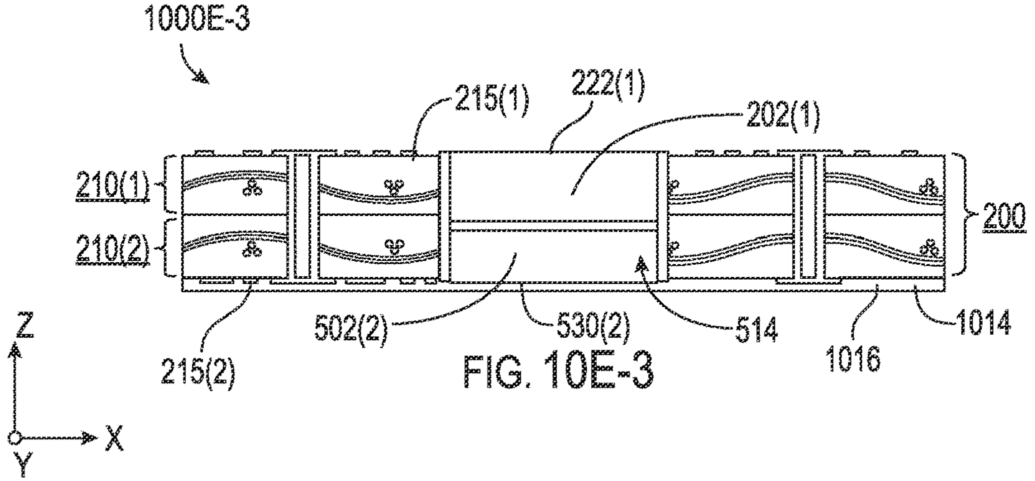
Figures 3, 10F:
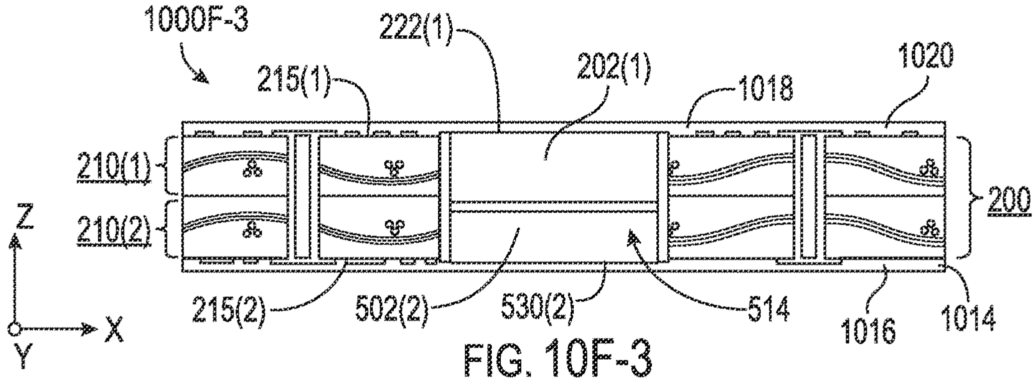
Figures 3, 9D:
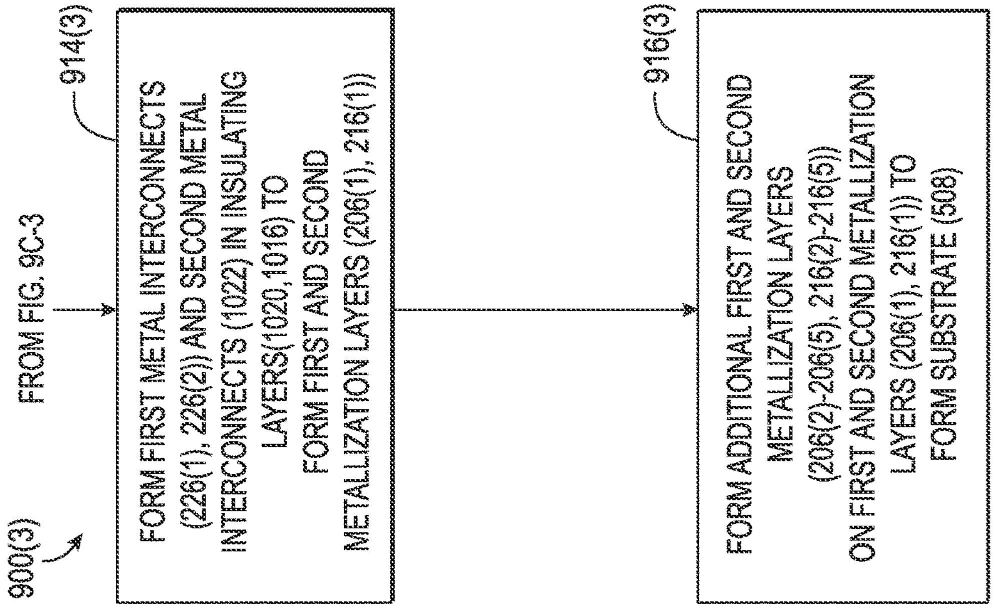
Figures 3, 10G:
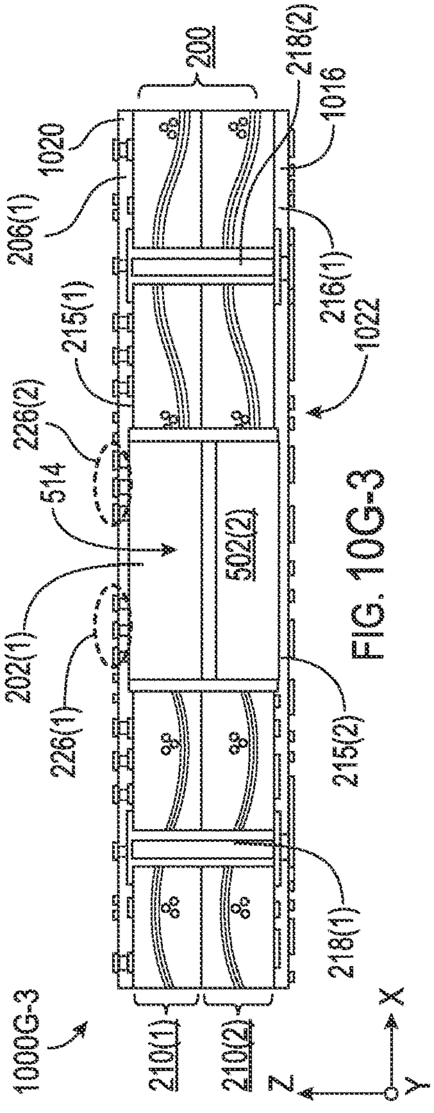
Figures 3, 10H:
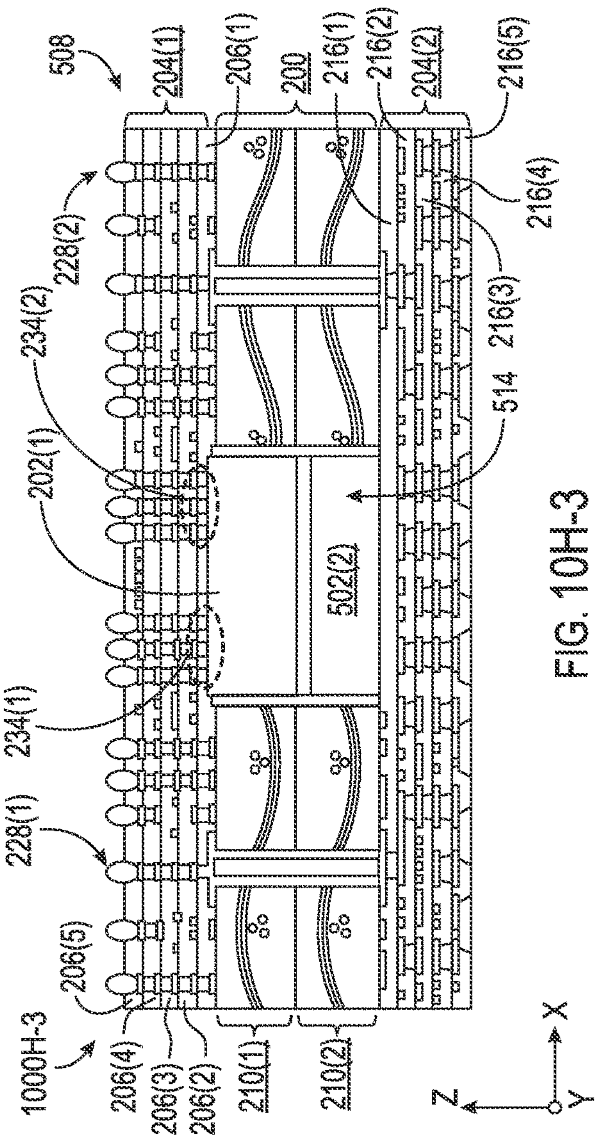

Then, as one option, as shown in the exemplary fabrication stage 1000D-3A in FIG. 10D-3A, a next step in the fabrication process 900(3) can be to fill in smaller voids between the embedded electrical device structure 514 and the inside walls 1008(1), 1008(2) in the second, horizontal direction (X-axis direction) to secure the embedded electrical device structure 514 within the cavity 212 (block 908A (3) in FIG. 9A). For example, a filler material 1010(1), 1010(2) can be filled in the voids in the cavity 212 between the embedded electrical device structure 514 and the inside walls 1008(1), 1008(2) in the second, horizontal direction (X-axis direction) to the underside surface 1006 of the carrier film 1004. As another alternative option, as shown in the exemplary fabrication stage 1000D-3B in FIG. 10D-3B, the next step in the fabrication process 900(3) could be to fill in smaller voids between the embedded electrical device structure 514 and the inside walls 1008(1), 1008(2) in the second, horizontal direction (X-axis direction) with the same laminate material 1012 as used to form a build-up laminate layer 1014 on the second surface 215(2) of the core 200 (block 908B(3) in FIG. 9B-3). This laminate layer 1014 also provides a second insulating layer 1016 in which a second metallization layer 216(1) will be formed as part of the second metallization structure 204(2) (see FIG. 2). Because the second spacer 502(2) is provided as part of the embedded electrical device structure 514 in the cavity 212, the second back side 530(2) of the second spacer 502(2) provides a firm surface on which the laminate layer 1014 can be disposed and undulation of the laminate layer 1014 can be reduced or avoided in the area of the cavity 212.

Then, as shown in the exemplary fabrication stage 1000E-3 in FIG. 10E-3, a next step in the fabrication process 900(3) can be to remove the temporary carrier film 1004 from the first surface 215(1) of the core 200 that is also coupled to the first front side 222(1) of the first electrical device 202(1) of the embedded electrical device structure 514 (block 910(3) in FIG. 9C-3). The second back side 530(2) of the second spacer 502(2) of the embedded electrical device structure 514 is secure in the cavity 212 due to the presence of the bottom laminate layer 1014 on the second surface 215(2) of the core 200. If the first option of using the filler material 1010(1), 1010(2) as shown in fabrication stage 1000D-3A in FIG. 10D-3A was used to fill the voids in the cavity 212, the fabrication stage 1000E-3 in FIG. 10E-3 can also involve forming the laminate layer 1014 on the second surface 215(1) of the core 200 adjacent to the second back side 530(2) of the second spacer 502(2) of the embedded electrical device structure 514.

Then, as shown in the exemplary fabrication stage 1000F-3 in FIG. 10F-3, a next step in the fabrication process 900(3) can be to form a laminate layer 1018 on the first surface 215(1) of the core 200 and in contact with the front first side 222(1) of the first electrical device 202(1) of the embedded electrical device structure 514 (block 912(3) in FIG. 9C-3). The laminate layer 1018 will become the first insulating layer 1020 for the first metallization layer 206(1) of the first metallization structure 204(1) (FIG. 5). Because the first electrical device 202(1) is provided as part of the embedded electrical device structure 514 in the cavity 212, the first front side 222(1) of the first electrical device 202(1) provides a firm surface on which the laminate layer 1018 can be disposed and undulation of the laminate layer 1018 can be reduced or avoided in the area of the cavity 212.

Then, as shown in the exemplary fabrication stage 1000G-3 in FIG. 10G-3, a next step in the fabrication process 900(3) can be to form the first metal interconnects 226(1), 226(2) in the first insulating layer 1020 to form the first metallization layer 206(1) (block 914(3) in FIG. 9D-3). The second metal interconnects 1022 are also formed in the insulating layer 1016 to form the second metallization layer 216(2) (block 914(3) in FIG. 9D-3). Then, as shown in the exemplary fabrication stage 1000H-3 in FIG. 10H-3, a next step in the fabrication process 900(3) can be to form the additional first and second metallization layers 206(2)-206(5), 216(2)-216(5) on the respective first and second metallization layers 206(1), 216(1) to form the substrate 508 (block 916(2) in FIG. 9D-3).

Note that any of the cores referred to herein that have a cavity(ies) formed therein that includes an embedded electrical device structure of an electrical device built upon another second component(s) to make the overall height of the embedded electrical device structure compatible with the height of the cavity of the core, including, but not limited to the cores 122(1), 122(2), 200, can include one or more core layers that can be made from a material (e.g., FR4, PI, glass sheet) that provide additional strength and firmness to reduce or avoid warpage in an IC package incorporating the core to provide a platform upon which additional metallization layer(s) can be built upon. Also note that any of the substrates referred to herein, including, but not limited to, the substrates 108(1), 108(2), 208, 408, 508 in FIGS. 1, 2, 4, 5,10H-1, 10H-2, and 10H-3, refer to a substrate that has one or more metallization layers that include a metal interconnect(s) to provide signal routing path(s). Also note that by stating that an electrical device is embedded in a cavity of a core, the electrical device could be fully embedded or partially embedded in such cavity in the core. A partially embedded electrical device means that at least a portion of the electrical device extends outside the cavity and its opening in the direction of the cavity. A fully embedded electrical device means that the electrical device is fully embedded within the cavity such that no portion of the electrical device extends outside the cavity and its opening in the direction of the cavity. An electrical device that is at least partially embedded in a cavity means that the electrical device could be fully or partially embedded in the cavity.

Note that by any of the embedded electrical device structures discussed herein being "embedded" in their cavity, this means that the embedded electrical device structure is at least partially within a cavity. For example, the embedded electrical device structure can either partially consume the volume of a cavity, or fully consume the volume of a cavity. Further, a portion of an embedded electrical device structure can extend outside of a cavity.

Also note that a substrate that includes a core with a cavity formed therein that includes an embedded electrical device structure of a first electrical device coupled to a second electrical device in a back-to-front configuration to make the overall height of the embedded electrical device structure compatible with the height of the cavity of the core, is not limited to a single embedded device structure provided in a single cavity in the core. The core of the substrate could include multiple cavities that each have an embedded electrical device structure of a first electrical device coupled to a second electrical device in a back-to-front configuration to make the overall height of the embedded electrical device structure compatible with the height of the cavity of the core, is not limited to a single embedded device structure provided in the cavity.

Also note that an embedded electrical device structure disposed in the cavity of a core of a substrate that has a first electrical device built-upon another second component(s) to make the overall height of the embedded electrical device structure compatible with the height of the cavity of the core, is not limited to only two (2) electrical devices or components being disposed in such cavity. More than two (2) electrical devices or components could be disposed in the cavity.

Also note that a core of a substrate that has a cavity(ies) formed therein that includes an embedded electrical device structure of an electrical device built upon another second component(s) to make the overall height of the embedded electrical device structure compatible with the height of the cavity of the core, could have multiple cavities wherein an embedded electrical device structure is disposed within each cavity.

An object being "adjacent" as discussed herein relates to an object being beside or next to another stated object. Adjacent objects may not be directly physically coupled to each other. An object can be directly adjacent to another object which means that such objects are directly beside or next to the other object without another object or layer being intervening or disposed between the directly adjacent objects. An object can be indirectly or non-directly adjacent to another object which means that such objects are not directly beside or directly next to each other, but there is an intervening object or layer disposed between the non-directly adjacent objects.

An IC package that includes a substrate that includes a core with a cavity(ies) formed therein that includes an embedded electrical device structure of an electrical device built upon another second component(s) to make the overall height of the embedded electrical device structure compatible with the height of the cavity of the core, including, but not limited to, the cores 122(1), 122(2), 200 and substrates 108(1), 108(2), 208, 408, 508 in FIGS. 1, 2, 4, 5, 10H-1, 10H-2, and 10H-3, and according to, but not limited to, the exemplary fabrication processes 600, 700, 900(1), 900(2), 900(3) in FIGS. 6, 7, 9A-9D-1, 9A-9D-2, and 9A-9D-3, may be provided in an IC package provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 11:
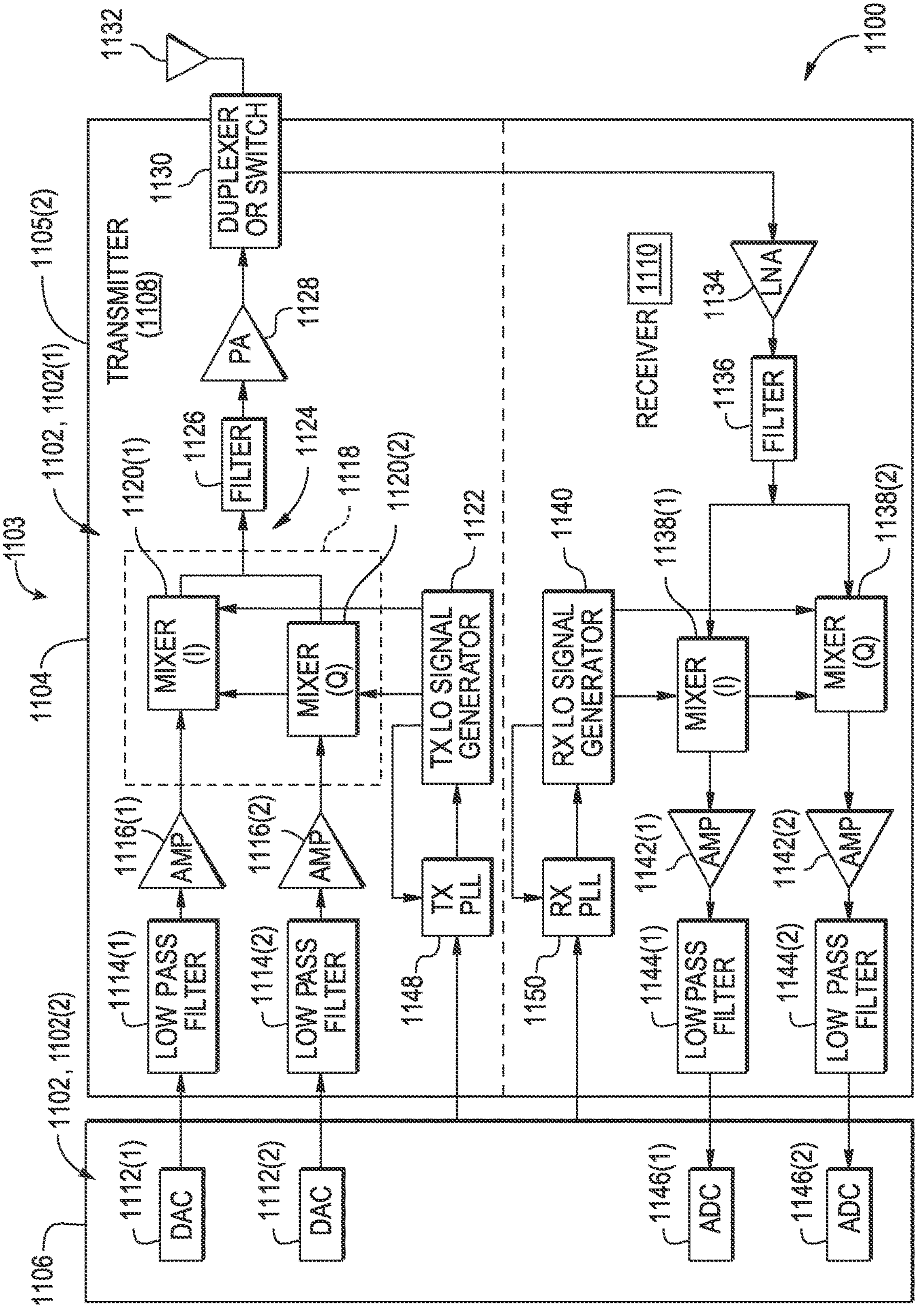
FIG. 11 is a block diagram of an exemplary wireless communications device that includes radio-frequency (RF) components that can include an IC package that includes a substrate that includes a core with a cavity(ies) formed therein that includes an embedded electrical device structure of an electrical device built upon another second component(s) to make the overall height of the embedded electrical device structure compatible with the height of the cavity of the core, including, but not limited to, the substrates in FIGS. 1, 2, 4, 5, 10H-1, 10H-2, and 10H-3, and according to, but not limited to, the exemplary fabrication processes in FIGS. 6, 7, 9A-9D-1, 9A-9D-2, and 9A-9D-3.

In this regard, FIG. 11 illustrates an exemplary wireless communications device 1100 that includes radio frequency (RF) components that can be included in an IC package(s) 1102(1), 1102(2) that includes a substrate that includes a core with a cavity(ies) formed therein that includes an embedded electrical device structure of an electrical device built upon another second component(s) to make the overall height of the embedded electrical device structure compatible with the height of the cavity of the core, including, but not limited to, the cores 122(1), 122(2), 200 and substrates 108(1), 108(2), 208, 408, 508 in FIGS. 1, 2, 4, 5, 10H-1, 10H-2, and 10H-3, and according to, but not limited to, the exemplary fabrication processes 600, 700, 900(1), 900(2), 900(3) in FIGS. 6, 7, 9A-9D-1, 9A-9D-2, and 9A-9D-3. The wireless communications device 1100 may include or be provided in any of the above-referenced devices, as examples. The wireless communications device 1100 may be provided in an IC 1103. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency up-conversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency up-conversion, while the RX LO signal generator 1140 generates the I and Q RX LO signals used for frequency down-conversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Figure 12:
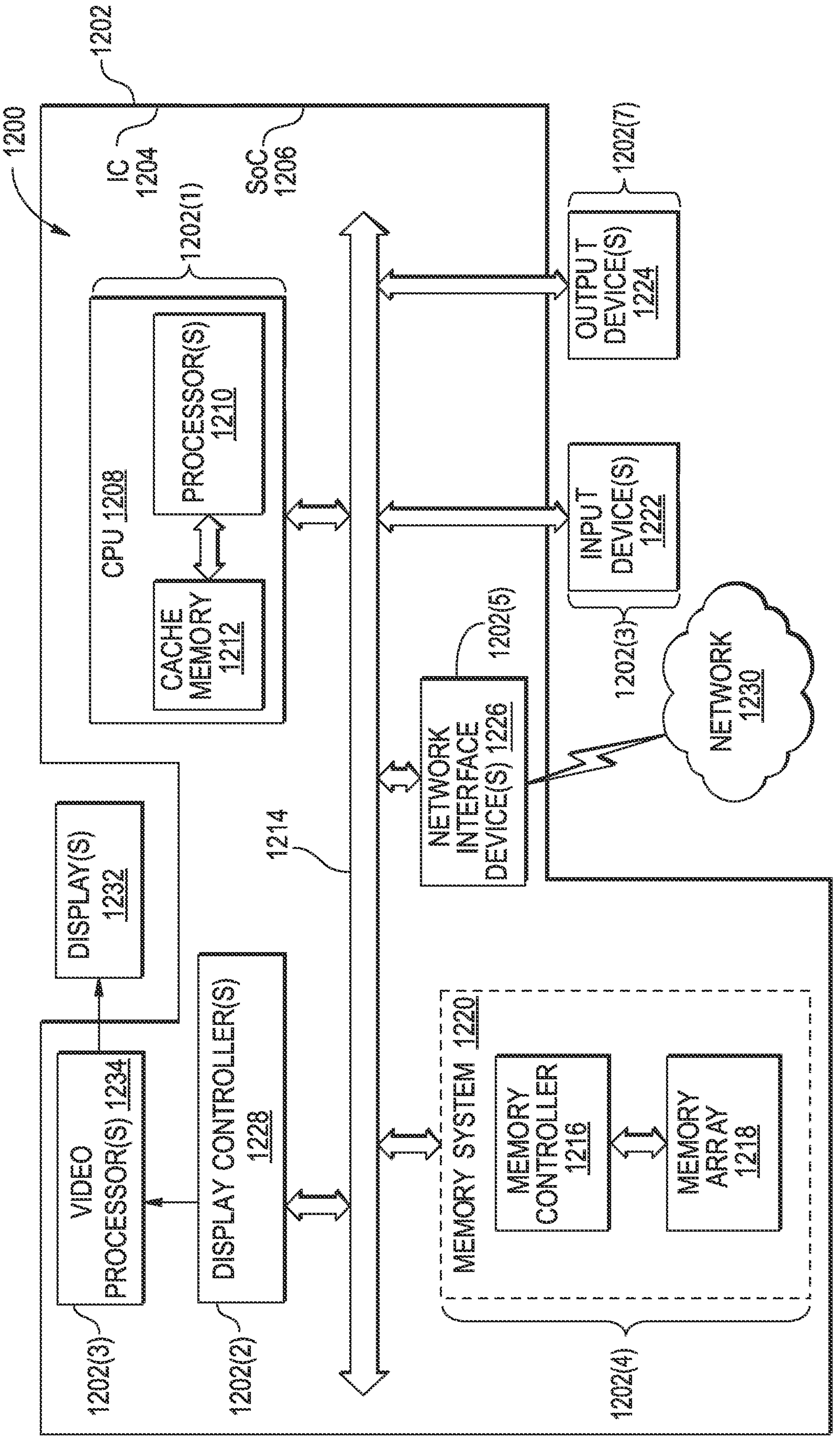
FIG. 12 is a block diagram of an exemplary processor-based system that can include components that can include an IC package that includes a substrate that includes a core with a cavity(ies) formed therein that includes an embedded electrical device structure of an electrical device built upon another second component(s) to make the overall height of the embedded electrical device structure compatible with the height of the cavity of the core, including, but not limited to, the substrates in FIGS. 1, 2, 4, 5, 10H-1, 10H-2, and 10H-3, and according to, but not limited to, the exemplary fabrication processes in FIGS. 6, 7, 9A-9D-1, 9A-9D-2, and 9A-9D-3.

FIG. 12 illustrates an example of a processor-based system 1200 that includes an IC package(s) 1202, 1202(1)-1202(7) that includes a substrate that includes a core with a cavity(ies) formed therein that includes an embedded electrical device structure of an electrical device built upon another second component(s) to make the overall height of the embedded electrical device structure compatible with the height of the cavity of the core, including, but not limited to, the cores 122(1), 122(2), 200 and substrates 108(1), 108(2), 208, 408, 508 in FIGS. 1, 2, 4, 5, 10H-1, 10H-2, and 10H-3, and according to, but not limited to, the exemplary fabrication processes 600, 700, 900(1), 900(2), 900(3) in FIGS. 6, 7, 9A-9D-1, 9A-9D-2, and 9A-9D-3. In this example, the processor-based system 1200 may be formed as an IC 1204 and as a system-on-a-chip (SoC) 1206. The processor-based system 1200 includes a central processing unit (CPU) 1208 that includes one or more processors 1210, which may also be referred to as CPU cores or processor cores. The CPU 1208 may have cache memory 1212 coupled to the CPU 1208 for rapid access to temporarily stored data. The CPU 1208 is coupled to a system bus 1214 and can intercouple master and slave devices included in the processor-based system 1200. As is well known, the CPU 1208 communicates with these other devices by exchanging address, control, and data information over the system bus 1214. For example, the CPU 1208 can communicate bus transaction requests to a memory controller 1216, as an example of a slave device. Although not illustrated in FIG. 12, multiple system buses 1214 could be provided, wherein each system bus 1214 constitutes a different fabric.

Other master and slave devices can be connected to the system bus 1214. As illustrated in FIG. 12, these devices can include a memory system 1220 that includes the memory controller 1216 and a memory array(s) 1218, one or more input devices 1222, one or more output devices 1224, one or more network interface devices 1226, and one or more display controllers 1228, as examples. The input device(s) 1222 can include any type of input device, including, but not limited to, input keys, switches, voice processors, etc. The output device(s) 1224 can include any type of output device, including, but not limited to, audio, video, other visual indicators, etc. The network interface device(s) 1226 can be any device configured to allow exchange of data to and from a network 1230. The network 1230 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1226 can be configured to support any type of communications protocol desired.

The CPU 1208 may also be configured to access the display controller(s) 1228 over the system bus 1214 to control information sent to one or more displays 1232. The display controller(s) 1228 sends information to the display(s) 1232 to be displayed via one or more video processors 1234, which process the information to be displayed into a format suitable for the display(s) 1232. The display(s) 1232 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A substrate, comprising:
   - a first metallization structure comprising one or more first metallization layers;
   - a second metallization structure comprising one or more second metallization layers; and
   - a core between the first metallization structure and the second metallization structure in a first direction, the core having a first height in the first direction, the core comprising:
     - a cavity; and
     - an embedded electrical device structure having a second height of at least the first height in the first direction, the embedded electrical device structure disposed in the cavity and comprising:
       - a first electrical device adjacent to the first metallization structure and;
       - a second component adjacent to the first electrical device and the second metallization structure.
2. The substrate of clause 1, wherein the first electrical device has a third height in the first direction less than the second height.
3. The substrate of any of clauses 1-2, wherein:
   - the first electrical device comprises a first side adjacent to the first metallization structure and a second side opposite the first side in the first direction; and

- the second component comprises a third side adjacent to the second side of the first electrical device and a fourth side opposite the third side in the first direction, the fourth side adjacent to the second metallization structure.
4. The substrate of clause 3, wherein:
   - the core comprises a first surface adjacent to the first metallization structure and a second surface opposite the first surface in the first direction, the second surface adjacent to the second metallization structure;
   - the first side of the first electrical device is co-planar with the first surface of the core; and
   - the fourth side of the second component is co-planar with the second surface of the core.
5. The substrate of any of clauses 1-4, wherein the first electrical device is directly connected to the second component.
6. The substrate of any of clauses 1-4, further comprising a film material in the cavity between the first electrical device and the second component.
7. The substrate of any of clauses 1-4, further comprising an adhesive layer in the cavity between the first electrical device and the second component.
8. The substrate of any of clauses 1-7, wherein the second component comprises a second electrical device.
9. The substrate of any of clauses 1-7, wherein the second component comprises a silicon spacer.
10. The substrate of any of clauses 1-9, wherein:
    - the second component comprises a second electrical device;
    - the first electrical device comprises:
      - a first front side adjacent to the first metallization structure;
      - a first back side opposite the first front side in the first direction; and
      - one or more first metal interconnects each exposed from the first front side and coupled to the first metallization structure; and
    - the second electrical device comprises:
      - a second front side adjacent to the first back side of the first electrical device;
      - a second back side opposite the second front side in the first direction, the second back side adjacent to the second metallization structure; and
      - one or more second metal interconnects each exposed from the second front side.
11. The substrate of clause 10, further comprising:
    - one or more vias each coupled to the first metallization structure and extending through the first electrical device from the first front side to the first back side in the first direction;
    - wherein:
      - at least one second metal interconnect of the one or more second metal interconnects is coupled to at least one via of the one or more vias.
12. The substrate of any of clauses 1-9, wherein:
    - the second component comprises a second electrical device;
    - the first electrical device comprises:
      - a first front side adjacent to the first metallization structure;
      - a first back side opposite the first front side in the first direction; and
      - one or more first metal interconnects each exposed from the first front side and coupled to the first metallization structure; and the second electrical device comprises:

a second back side adjacent to the first back side of the first electrical device;

a second front side opposite the second back side in the first direction, the second front side adjacent to the second metallization structure; and one or more second metal interconnects each exposed from the second front side and coupled to the second metallization structure.

13. The substrate of clause 12, further comprising an adhesive layer in the cavity between the first electrical device and the second electrical device.

14. The substrate of any of clauses 1-9, wherein:

the second component comprises a spacer structure;

the first electrical device comprises:

a first front side adjacent to the first metallization structure;

a first back side opposite the first front side in the first direction; and one or more first metal interconnects each exposed from the first front side and coupled to the first metallization structure; and the spacer structure comprises:

a second front side adjacent to the first back side of the first electrical device;

a second back side opposite the second back side in the first direction, the second front side adjacent to the second metallization structure.

15. The substrate of clause 14, wherein the spacer structure comprises a silicon substrate.

16. The substrate of any of clauses 14-15, wherein the first electrical device is directly connected to the spacer structure.

17. The substrate of any of clauses 1-16, wherein the embedded electrical device structure is at least partially embedded in the cavity.

18. The substrate of any of clauses 1-17, wherein:

the first electrical device is a device comprised from the group consisting of a passive device, capacitor, a deep trench capacitor (DTC), a resistor, an inductor, an integrated circuit (IC), and an IC die.

19. The substrate of any of clauses 1-18 integrated into a device selected from a group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

20. A method of fabricating a substrate, comprising:

forming a core having a first height in a first direction;

forming a cavity in the core; and placing an embedded electrical device structure having a second height of at least the first height in the first direction in the cavity, the embedded electrical device structure comprising:

a first electrical device; and a second component adjacent to the first electrical device in the first direction;

coupling a first metallization structure comprising one or more first metallization layers to the core and the first electrical device; and coupling a second metallization structure comprising one or more second metallization layers to the core and the second component, such that the core is between the first metallization structure and the second metallization structure in the first direction.

21. The method of clause 20, wherein placing the embedded electrical device structure in the cavity further comprises:

placing a first side of the first electrical device adjacent to the first metallization structure, wherein the first electrical device further comprises a second side opposite the first side in the first direction; and placing a fourth side of the second component adjacent to the second metallization structure, wherein the second component further comprises a third side opposite the fourth side in the first direction, the third side of the second component adjacent to the second side of the first electrical device.

22. The method of clause 21, wherein:

placing the first side of the first electrical device adjacent to the first metallization structure further comprises placing the first side of the first electrical device co-planar with a first surface of the core adjacent to the first metallization structure; and placing the fourth side of the second component adjacent to the second metallization structure further comprises placing the fourth side of the second component co-planar with a second surface of the core adjacent to the second metallization structure, the second surface of the core opposite the first surface of the core in the first direction.

23. The method of any of clauses 20-22, wherein the second component comprises a second electrical device, and further comprising:

forming one or more vias extending through the first electrical device from a first front side of the first electrical device adjacent to the first metallization structure, to a first back side of the first electrical device opposite the first front side in the first direction;

coupling at least one first metal interconnect of one or more first metal interconnects each exposed from the first front side of the first electrical device adjacent to the first metallization structure, to the first metallization structure; and coupling at least one second metal interconnect of one or more second metal interconnects each exposed from a second front side of the second electrical device adjacent to the second metallization structure, to at least one via of the one or more vias.

24. The method of any of clauses 20-22, wherein the second component comprises a second electrical device, and further comprising:

coupling at least one first metal interconnect of one or more first metal interconnects each exposed from a first front side of the first electrical device adjacent to the first metallization structure, to the first metallization structure; and coupling at least one second metal interconnect of one or more second metal interconnects each exposed from a second back side of the second electrical device adjacent to the second metallization structure, to the second metallization structure.

25. The method of any of clauses 20-22, wherein the second component comprises a spacer structure, and further comprising:
coupling at least one first metal interconnect of one or more first metal interconnects each exposed from a first front side of the first electrical device adjacent to the first metallization structure, to the first metallization structure;
placing a third side of the spacer structure adjacent to a first back side of the first electrical device opposite of the first front side of the first electrical device in the first direction; and
placing a fourth side of the spacer structure opposite the third side in the first direction, adjacent to the second metallization structure.

26. The method of any of clauses 20-25, further comprising laminating a first surface of the core with a carrier film;
wherein:
placing the embedded electrical device structure in the cavity further comprises placing a first front side of the first electrical device in contact with the carrier film; and
further comprising:
forming a second laminate layer on a second surface of the core opposite the first surface in the first direction and in contact with a second side of the second component.

27. The method of clause 26, wherein forming the second laminate layer on the second surface of the core further comprises disposing a laminate material of the second laminate layer in the cavity adjacent to the embedded electrical device structure in a second direction orthogonal to the first direction.

28. The method of clause 26, further comprising disposing a filler material in the cavity adjacent to the embedded electrical device structure in a second direction orthogonal to the first direction.

29. The method of any of clauses 26-28, further comprising:
detaching the carrier film from the first surface of the core and the first front side of the first electrical device; and
forming a first laminate layer on the first surface of the core in contact with the first front side of the first electrical device.

30. The method of clause 29, wherein:
coupling the first metallization structure to the core comprises coupling the first metallization structure to the first laminate layer; and
coupling the second metallization structure to the core comprises coupling the second metallization structure to the second laminate layer.

31. The method of clause 30, wherein:
coupling the first metallization structure to the core comprises:
forming a first, first metallization layer of the one or more first metallization layers of the first metallization structure to the first laminate layer; and
forming one or more second, first metallization layers of the one or more first metallization layers of the first metallization structure to the first, first metallization layer; and
coupling the second metallization structure to the core comprises:
forming a first, second metallization layer of the one or more second metallization layers of the second metallization structure to the second laminate layer; and
forming one or more second, second metallization layers of the one or more second metallization layers of the second metallization structure to the first, second metallization layer.

What is claimed is:

1. A substrate, comprising:
a first metallization structure comprising one or more first metallization layers;
a second metallization structure comprising one or more second metallization layers; and
a core between the first metallization structure and the second metallization structure in a first direction, the core having a first height in the first direction, the core comprising:
a cavity; and
an embedded electrical device structure having a second height of at least the first height in the first direction, the embedded electrical device structure disposed in the cavity and comprising:
a first electrical device adjacent to the first metallization structure, wherein the first electrical device comprises:
a first front side adjacent to the first metallization structure;
a first back side opposite the first front side in the first direction; and
one or more first metal interconnects each exposed from the first front side and coupled to the first metallization structure; and
a second component adjacent to the first electrical device and the second metallization structure, the second component comprising a spacer structure;
wherein the spacer structure comprises:
a second front side adjacent to the first back side of the first electrical device; and
a second back side opposite the second back side in the first direction, the second front side adjacent to the second metallization structure.

2. The substrate of claim 1, wherein the first electrical device has a third height in the first direction less than the second height.

3. The substrate of claim 1, wherein:
the first electrical device comprises a first side adjacent to the first metallization structure and a second side opposite the first side in the first direction; and
the second component comprises a third side adjacent to the second side of the first electrical device and a fourth side opposite the third side in the first direction, the fourth side adjacent to the second metallization structure.

4. The substrate of claim 3, wherein:
the core comprises a first surface adjacent to the first metallization structure and a second surface opposite the first surface in the first direction, the second surface adjacent to the second metallization structure;
the first side of the first electrical device is co-planar with the first surface of the core; and
the fourth side of the second component is co-planar with the second surface of the core.

5. The substrate of claim 1, wherein the spacer structure comprises a silicon substrate.

6. The substrate of claim 1, wherein the first electrical device is directly connected to the spacer structure.

7. The substrate of claim 1, wherein the first electrical device is directly connected to the second component.

8. The substrate of claim 1, further comprising a film material in the cavity between the first electrical device and the second component.

9. The substrate of claim 1, further comprising an adhesive layer in the cavity between the first electrical device and the second component.

10. The substrate of claim 1, wherein the second component comprises a second electrical device.

11. The substrate of claim 1, wherein the second component comprises a silicon spacer.

12. The substrate of claim 1, wherein:

the second component comprises a second electrical device;

the first electrical device comprises:

a first front side adjacent to the first metallization structure;

a first back side opposite the first front side in the first direction; and one or more first metal interconnects each exposed from the first front side and coupled to the first metallization structure; and the second electrical device comprises:

a second front side adjacent to the first back side of the first electrical device;

a second back side opposite the second front side in the first direction, the second back side adjacent to the second metallization structure; and one or more second metal interconnects each exposed from the second front side.

13. The substrate of claim 12, further comprising:

one or more vias each coupled to the first metallization structure and extending through the first electrical device from the first front side to the first back side in the first direction;

wherein:

at least one second metal interconnect of the one or more second metal interconnects is coupled to at least one via of the one or more vias.

14. The substrate of claim 1, wherein:

the second component comprises a second electrical device;

the first electrical device comprises:

a first front side adjacent to the first metallization structure;

a first back side opposite the first front side in the first direction; and one or more first metal interconnects each exposed from the first front side and coupled to the first metallization structure; and the second electrical device comprises:

a second back side adjacent to the first back side of the first electrical device;

a second front side opposite the second back side in the first direction, the second front side adjacent to the second metallization structure; and one or more second metal interconnects each exposed from the second front side and coupled to the second metallization structure.

15. The substrate of claim 14, further comprising an adhesive layer in the cavity between the first electrical device and the second electrical device.

16. The substrate of claim 1, wherein the embedded electrical device structure is at least partially embedded in the cavity.

17. The substrate of claim 1, wherein:

the first electrical device is a device comprised from the group consisting of a passive device, capacitor, a deep trench capacitor (DTC), a resistor, an inductor, an integrated circuit (IC), and an IC die.

18. The substrate of claim 1 integrated into a device selected from a group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

* * * * *